US012568836B2

(12) United States Patent
Kim

(10) Patent No.: US 12,568,836 B2
(45) Date of Patent: Mar. 3, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventor: Seungmin Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 811 days.

(21) Appl. No.: 17/896,797

(22) Filed: Aug. 26, 2022

(65) Prior Publication Data

US 2023/0154855 A1      May 18, 2023

(30) Foreign Application Priority Data

Nov. 15, 2021      (KR) ......................... 10-2021-0156774

(51) Int. Cl.
*H01L 23/538*        (2006.01)
*H01L 23/00*         (2006.01)
(Continued)

(52) U.S. Cl.
CPC ...... *H01L 23/5386* (2013.01); *H01L 23/3128* (2013.01); *H01L 23/5383* (2013.01); *H01L 23/5384* (2013.01); *H01L 24/48* (2013.01); *H01L 25/0657* (2013.01); *H01L 2224/48147* (2013.01); *H01L 2224/48228* (2013.01); *H01L 2225/06562* (2013.01)

(58) Field of Classification Search
CPC ............. H01L 23/5386; H01L 23/3128; H01L 23/5383; H01L 23/5384; H01L 24/48; H01L 25/0657; H01L 2224/48147; H01L 2224/48228; H01L 2225/06562
See application file for complete search history.

(56) References Cited

U.S. PATENT DOCUMENTS 8,522,426 B2      9/2013   Takahashi et al.
8,707,554 B2      4/2014   Maeda et al.
(Continued)

FOREIGN PATENT DOCUMENTS

EP              1194022 A1      4/2002
KR      10-2017-0083833 A      7/2017

*Primary Examiner* — Jacob Y Choi
*Assistant Examiner* — Neil R Prasad
(74) *Attorney, Agent, or Firm* — Sughrue Mion, PLLC

(57)      ABSTRACT

A semiconductor package includes a package substrate including a substrate body having a lower surface and a upper surface, a lower wiring layer on the lower surface and including a land region, an upper wiring layer on the upper surface and electrically connected to the lower wiring layer, and a solder resist layer on the lower surface and including an opening exposing the land region. The semiconductor package further includes a semiconductor chip on the package substrate and having contact pads electrically connected to the upper wiring layer, and a mold part on the package substrate, wherein the package substrate further includes an open region defined by a portion of a bottom surface of the package substrate on which the solder resist layer is not present and that is adjacent to at least one edge of the package substrate on the bottom surface of the package substrate.

20 Claims, 19 Drawing Sheets

300

(51) Int. Cl.
   H01L 23/31          (2006.01)
   H01L 25/065          (2023.01)

(56)                    References Cited

U.S. PATENT DOCUMENTS

2004/0053489  A1 *   3/2004  Kata ................... H01L 21/4857
                                                    438/622
2009/0173531  A1 *   7/2009  Kim ....................... H05K 3/427
                                                    174/262
2017/0125356  A1 *   5/2017  Yang ....................... H01L 24/96
2019/0269008  A1     8/2019  Liu et al.
2020/0128662  A1 *   4/2020  Liu ........................ H05K 3/064
2020/0260573  A1     8/2020  Ogawa et al.
2023/0065615  A1 *   3/2023  Kung ............... H01L 23/49827

* cited by examiner

A1

A2

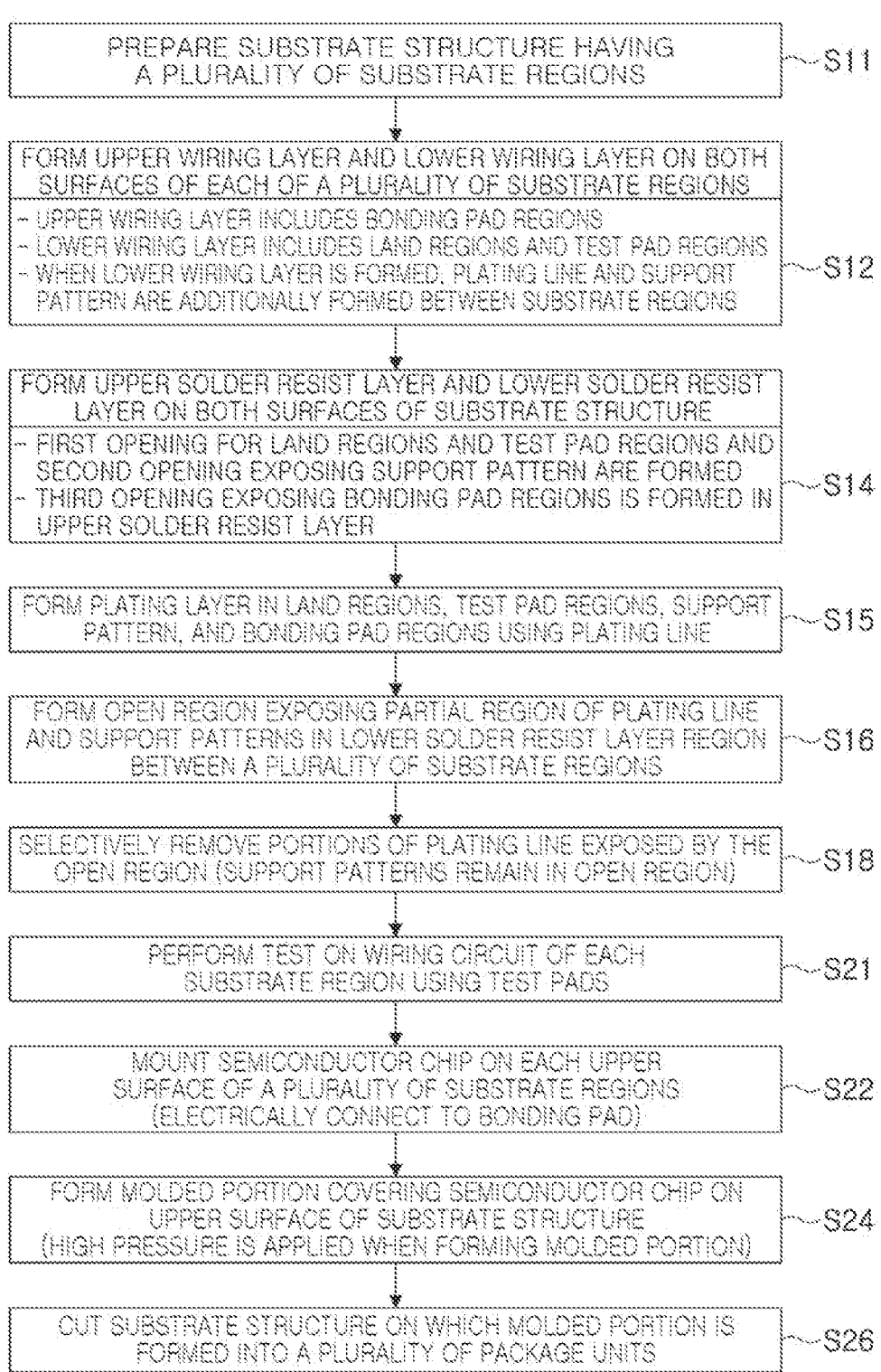

PREPARE SUBSTRATE STRUCTURE HAVING
A PLURALITY OF SUBSTRATE REGIONS — S11

FORM UPPER WIRING LAYER AND LOWER WIRING LAYER ON BOTH
SURFACES OF EACH OF A PLURALITY OF SUBSTRATE REGIONS
- UPPER WIRING LAYER INCLUDES BONDING PAD REGIONS
- LOWER WIRING LAYER INCLUDES LAND REGIONS AND TEST PAD REGIONS
- WHEN LOWER WIRING LAYER IS FORMED, PLATING LINE AND SUPPORT
  PATTERN ARE ADDITIONALLY FORMED BETWEEN SUBSTRATE REGIONS — S12

FORM UPPER SOLDER RESIST LAYER AND LOWER SOLDER RESIST
LAYER ON BOTH SURFACES OF SUBSTRATE STRUCTURE
- FIRST OPENING FOR LAND REGIONS AND TEST PAD REGIONS AND
  SECOND OPENING EXPOSING SUPPORT PATTERN ARE FORMED
- THIRD OPENING EXPOSING BONDING PAD REGIONS IS FORMED IN
  UPPER SOLDER RESIST LAYER — S14

FORM PLATING LAYER IN LAND REGIONS, TEST PAD REGIONS, SUPPORT
PATTERN, AND BONDING PAD REGIONS USING PLATING LINE — S15

FORM OPEN REGION EXPOSING PARTIAL REGION OF PLATING LINE
AND SUPPORT PATTERNS IN LOWER SOLDER RESIST LAYER REGION
BETWEEN A PLURALITY OF SUBSTRATE REGIONS — S16

SELECTIVELY REMOVE PORTIONS OF PLATING LINE EXPOSED BY THE
OPEN REGION (SUPPORT PATTERNS REMAIN IN OPEN REGION) — S18

PERFORM TEST ON WIRING CIRCUIT OF EACH
SUBSTRATE REGION USING TEST PADS — S21

MOUNT SEMICONDUCTOR CHIP ON EACH UPPER
SURFACE OF A PLURALITY OF SUBSTRATE REGIONS
(ELECTRICALLY CONNECT TO BONDING PAD) — S22

FORM MOLDED PORTION COVERING SEMICONDUCTOR CHIP ON
UPPER SURFACE OF SUBSTRATE STRUCTURE
(HIGH PRESSURE IS APPLIED WHEN FORMING MOLDED PORTION) — S24

CUT SUBSTRATE STRUCTURE ON WHICH MOLDED PORTION IS
FORMED INTO A PLURALITY OF PACKAGE UNITS — S26

FIG. 6

SEMICONDUCTOR PACKAGE AND METHOD OF MANUFACTURING THE SAME

CROSS-REFERENCE TO THE RELATED APPLICATION

This application claims priority under 35 USC 119(a) to Korean Patent Application No. 10-2021-0156774 filed on Nov. 15, 2021 in the Korean Intellectual Property Office, the disclosure of which is incorporated by reference herein in its entirety.

BACKGROUND

Embodiments of the present disclosure relate to a semiconductor package and a method of manufacturing the same.

In recent years, highly integrated semiconductor packages have been in demand in accordance with the miniaturization, thinness, and weight reduction of electronic devices, and accordingly, thinner package substrates are also required.

In addition, in addition to a function of electrically connecting electronic components such as semiconductor chips mounted thereon, package substrates also serve to mechanically fix the components. In particular, there is a need for a method capable of suppressing deformation or damage to a package substrate during a manufacturing process of a semiconductor package (in particular, before a cutting process).

SUMMARY

Embodiments of the present disclosure include a semiconductor package capable of preventing damage or deformation of a package substrate during a manufacturing process.

Embodiments of the present disclosure include a method of manufacturing a semiconductor package capable of preventing damage or deformation of a package substrate during a manufacturing process.

According to embodiments of the present disclosure, a semiconductor package is provided. The semiconductor package includes a package substrate including: a substrate body; a lower wiring layer on a lower surface of the substrate body and including a land region; an upper wiring layer on an upper surface of the substrate body and electrically connected to the lower wiring layer; and a solder resist layer on the lower surface of the substrate body and that includes an opening that exposes the land region of the lower wiring layer. The semiconductor package further includes: a semiconductor chip on the package substrate and including a plurality of contact pads electrically connected to the upper wiring layer; and a mold part on the package substrate and that seals the semiconductor chip, wherein the package substrate further includes: at least one open region defined by a portion of a bottom surface of the package substrate on which the solder resist layer is not present and that is adjacent to at least one edge of the package substrate on the bottom surface of the package substrate, and a plurality of support patterns in the open region and that extend from an end of the solder resist layer to the at least one edge.

According to embodiments of the present disclosure, a semiconductor package is provided. The semiconductor package includes: a package substrate; a semiconductor chip on the package substrate; and a mold part on the package substrate and that seals the semiconductor chip, wherein the package substrate includes: a core layer including a lower surface and an upper surface; a through-via that penetrates through the core layer from the lower surface of the core layer to the upper surface of the core layer; a first lower wiring layer and a first upper wiring layer respectively on the lower surface of the core layer and the upper surface of the core layer, and connected to each other by the through-via; a lower insulating layer and an upper insulating layer respectively on the lower surface of the core layer and the upper surface of the core layer, and on the first lower wiring layer and the first upper wiring layer, respectively; a second lower wiring layer and a second upper wiring layer respectively on the lower insulating layer and the upper insulating layer, and connected to the first lower wiring layer and the first upper wiring layer, respectively; a lower solder resist layer on the lower insulating layer such as to be on the second lower wiring layer, and including a first opening that exposes a land region of the second lower wiring layer; and an upper solder resist layer on the upper insulating layer such as to be on the second upper wiring layer, and including second openings that expose bonding pad regions of the second upper wiring layer. The package substrate further includes: a first open region defined by a first portion of a bottom surface of the package substrate on which the lower solder resist layer is not present and that is adjacent to a first edge of the package substrate on the bottom surface of the package substrate; a second open region defined by a second portion of the bottom surface of the package substrate on which the lower solder resist layer is not present and that is adjacent to a second edge of the package substrate on the bottom surface of the package substrate, the second edge opposite to the first edge; a plurality of first support patterns arranged in the first open region and that extend from a first end of the lower solder resist layer to the first edge; and a plurality of second support patterns arranged in the second open region and that extend from a second end of the lower solder resist layer to the second edge.

According to embodiments of the present disclosure, a semiconductor package is provided. The semiconductor package includes a package substrate including: a substrate body; a lower wiring layer on a lower surface of the substrate body and including a land region; an upper wiring layer on an upper surface of the substrate body and electrically connected to the lower wiring layer; and a solder resist layer on the lower surface of the substrate body and including an opening that exposes the land region. The semiconductor package further includes a semiconductor chip on the package substrate and including a plurality of contact pads electrically connected to the upper wiring layer; and a mold part on the package substrate and that seals the semiconductor chip. The package substrate further includes: a first open region defined by a first portion of a bottom surface of the package substrate on which the solder resist layer is not present and that is adjacent to a first edge of the package substrate on the bottom surface of the package substrate; a second open region defined by a second portion of the bottom surface of the package substrate on which the solder resist layer is not present and that is adjacent to a second edge of the package substrate on the bottom surface of the package substrate, the second edge opposite to the first edge; a plurality of first support patterns arranged in the first open region and that extend from a first end of the solder resist layer to the first edge; and a plurality of second support patterns arranged in the second open region and that extend from a second end of the solder resist layer to the second edge. The plurality of first support patterns includes: a metal layer that is on a same level as a level of the lower wiring layer; and a protective layer in the first open region and that is formed of a material that is the same as a material of a plating layer of the land region. The plurality of second support patterns includes: a metal layer that is on a same level as the level of the lower wiring layer; and a protective layer in the second open region and that is formed of a material that is the same as the material of the plating layer of the land region.

According to embodiments of the present disclosure, a semiconductor package is provided. The semiconductor package includes: a core layer including a lower surface and an upper surface; a through-via that penetrates through the core layer from the lower surface of the core layer to the upper surface of the core layer; a first lower wiring layer and a first upper wiring layer respectively on the lower surface of the core layer and the upper surface of the core layer, and connected to each other by the through-via; a lower insulating layer and an upper insulating layer respectively on the lower surface of the core layer and the upper surface of the core layer, and on the first lower wiring layer and the first upper wiring layer, respectively; a second lower wiring layer and a second upper wiring layer respectively on the lower insulating layer and the upper insulating layer, and connected to the first lower wiring layer and the first upper wiring layer, respectively; a lower solder resist layer on the lower insulating layer such as to be on the second lower wiring layer, and including first openings that expose land regions of the second lower wiring layer; and an upper solder resist layer on the upper insulating layer such as to be on the second upper wiring layer, and including second openings that expose bonding pad regions of the second upper wiring layer. The package substrate further includes: a first open region defined by a first portion of a bottom surface of the package substrate on which the lower solder resist layer is not present and that is adjacent to a first edge of the package substrate on the bottom surface of the package substrate; a second open region defined by a second portion of the bottom surface of the package substrate on which the lower solder resist layer is not present and that is adjacent to a second edge of the package substrate on the bottom surface of the package substrate, the second edge opposite to the first edge; a plurality of first support patterns arranged in the first open region and that extend from a first end of the lower solder resist layer to the first edge; and a plurality of second support patterns arranged in the second open region and that extend from a second end of the lower solder resist layer to the second edge.

According to embodiments of the present disclosure, a method of manufacturing a semiconductor package is provided. The method includes: forming a substrate structure that includes a plurality of substrate regions; forming an upper wiring layer on upper surfaces of the plurality of substrate regions; forming a lower wiring layer on lower surfaces of the plurality of substrate regions, the lower wiring layer including land regions and test pad regions; forming support patterns in a region of a lower surface of the substrate structure, between the plurality of substrate regions, during a process of forming the lower wiring layer, the support patterns connected to a plating line that is connected to the land regions and adjacent substrate regions among the plurality of substrate regions; forming a lower solder resist layer on a lower surface of the substrate structure; forming first openings in the lower solder resist layer that expose the land regions and the test pad regions; forming a plating layer in each of the land regions and the test pad regions using the plating line; forming an open region in a region of the lower solder resist layer that is between the plurality of substrate regions, the open region exposing a partial region of the plating line and the support patterns; selectively removing portions of the plating line exposed by the open region, the support patterns remaining in the open region; performing a test on the plurality of substrate regions using the test pad regions after the selectively removing; mounting a semiconductor chip on each of upper surfaces of the plurality of substrate regions after the performing of the test; forming a mold part on the semiconductor chip, on an upper surface of the substrate structure; and cutting the substrate structure, on which the mold part is formed, into a plurality of package substrate units.

BRIEF DESCRIPTION OF DRAWINGS

The above and other aspects, features, and advantages of embodiments of the present disclosure will be more clearly understood from the following detailed description, taken in conjunction with the accompanying drawings, in which:

FIG. 6 is a flowchart illustrating a method of manufacturing a semiconductor package according to an embodiment of the present disclosure.

DETAILED DESCRIPTION

Hereinafter, example embodiments of the present disclosure will be described with reference to the accompanying drawings.

Figure 1:
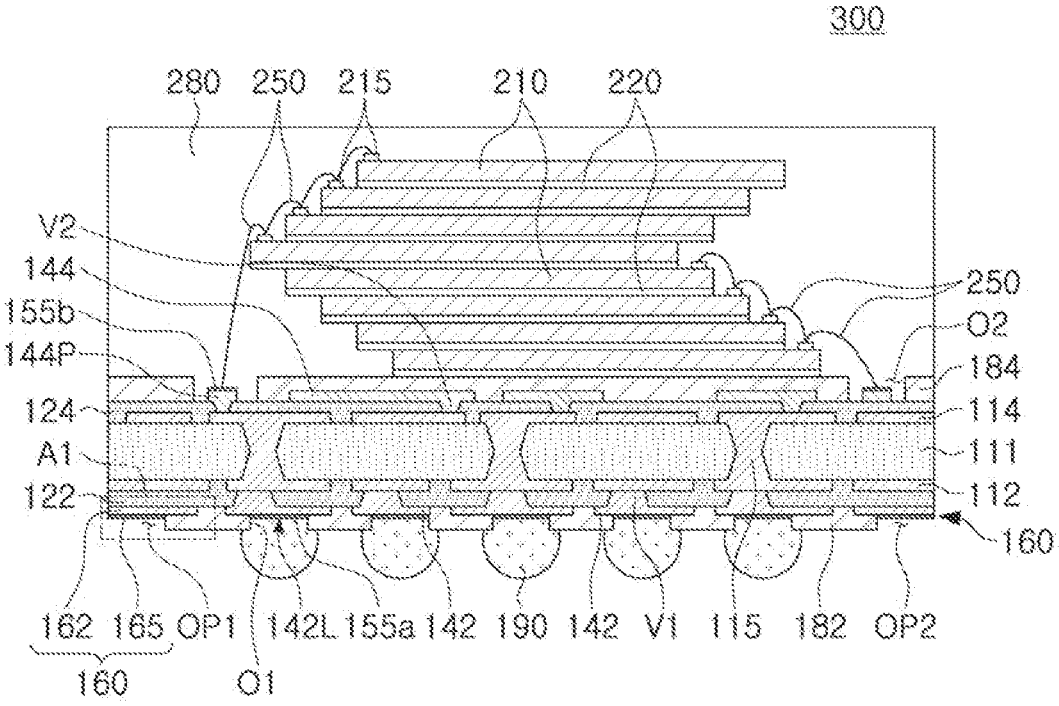
FIG. 1 is a cross-sectional side view of a semiconductor package according to an embodiment of the present disclosure.
Figure 2:
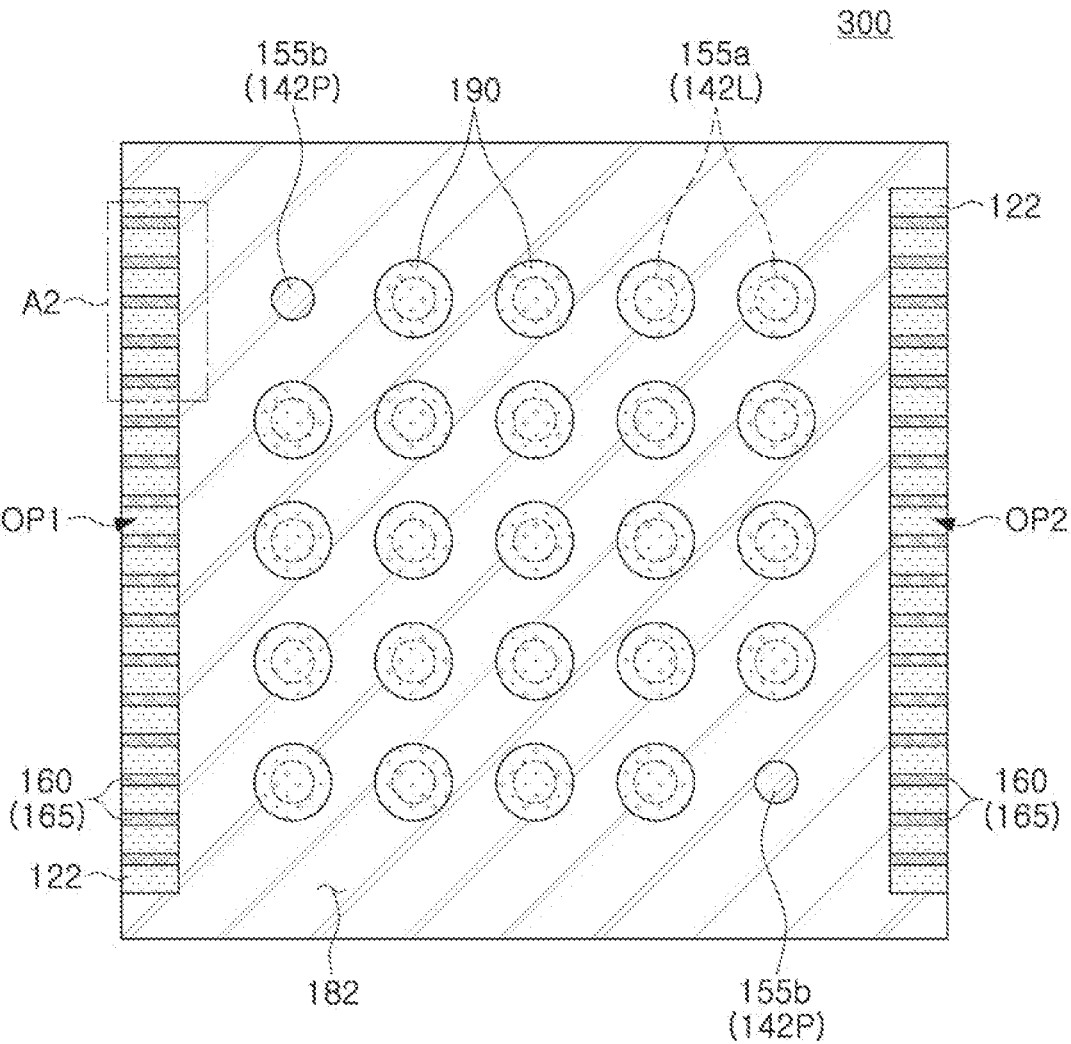
FIG. 2 is a bottom view of the semiconductor package of FIG. 1.

FIG. 1 is a cross-sectional side view of a semiconductor package according to an embodiment of the present disclosure, and FIG. 2 is a bottom view of the semiconductor package of FIG. 1.

Referring to FIG. 1, a semiconductor package 300 according to the present embodiment includes a package substrate 100, a plurality of semiconductor chips 210 disposed on an upper surface of the package substrate 100, and a mold part 280 disposed on the upper surface of the package substrate 100 and surrounding the plurality of semiconductor chips 210.

The package substrate 100 may include a core layer 111, at least one lower wiring layer (e.g., a first lower wiring layer 112 and a second lower wiring layer 142) disposed on a lower surface of the core layer 111, and at least one upper wiring layer (e.g., a first upper wiring layer 114 and a second upper wiring layer 144) disposed on an upper surface of the core layer 111. For example, the package substrate 100 may be a printed circuit board (PCB).

As illustrated in FIG. 1, a first lower wiring layer 112 and a first upper wiring layer 114 are disposed on the lower surface and the upper surface of the core layer 111 (also referred to as a "substrate body"), respectively. The first lower wiring layer 112 and the first upper wiring layer 114 may be connected in a thickness direction (e.g., vertical direction) of the core layer 111 by a through via 115 connecting the upper and lower surfaces of the core layer 111. A lower insulating layer 122 and an upper insulating layer 124 respectively covering the first lower wiring layer 112 and the first upper wiring layer 114 are disposed on a lower surface and an upper surface of the core layer 111, respectively. A second lower wiring layer 142 and a second upper wiring layer 144 may be disposed on the lower insulating layer 122 and the upper insulating layer 124, respectively. The second lower wiring layer 142 and the second upper wiring layer 144 may be respectively connected to the first lower wiring layer 112 and the first upper wiring layer 114 through vias V1 and V2, respectively. Here, the second lower wiring layer 142 and the second upper wiring layer 144 are provided as outermost wiring layers of the package substrate 100.

As described above, the package substrate 100 employed in the present embodiment may include a wiring circuit including the first lower wiring layer 112, the second lower wiring layer 142, the first upper wiring layer 114, the second upper wiring layer 144, and the through via 115. In the present embodiment, the stacking number of the lower and upper wiring layers is illustrated as two layers, but embodiments of the present disclosure are not limited thereto, and the lower and upper wiring layers may be configured as three or more wiring layers, or the lower and upper wiring layers may have different stacking numbers.

The core layer 111, the lower insulating layer 122, and the upper insulating layer 124 may be formed of an insulating material having excellent numerical stability, heat resistance, and chemical resistance, and flame retardancy. For example, the core layer 111 may be an insulating material obtained by containing a glass filler, ceramic powder, etc. in an epoxy-based resin. For example, the lower insulating layer 122 and the upper insulating layer 124 may be a prepreg such as an epoxy resin or acrylate impregnated with reinforcing fibers. The lower insulating layer 122 and the upper insulating layer 124 may be formed by, for example, lamination through thermocompression bonding, rolling, dipping, or the like. The first lower wiring layer 112, the second lower wiring layer 142, the first upper wiring layer 114, and the second upper wiring layer 144 may include copper (Cu), but are not limited thereto and may include at least one from among aluminum (Al), silver (Ag), gold (Au), and nickel (Ni).

In some embodiments, the core layer may be a copper clad laminate, and the first lower wiring layer 112 and the first upper wiring layer 114 may be a pattern obtained by forming a plating layer (e.g., Cu) after patterning a copper foil. The through via 115 may be formed by filling a hole formed in the core layer 111 using, for example, laser drilling, with a conductive material (e.g., Cu).

The package substrate 100 employed in the present embodiment may further include a lower solder resist layer 182 disposed on the lower insulating layer 122 to cover the second lower wiring layer 142 and may include an upper solder resist layer 184 disposed on the upper insulating layer 124 to cover the second upper wiring layer 144.

Referring to FIGS. 1 and 2, the lower solder resist layer 182 has a first opening O1 exposing a land region 142L of the second lower wiring layer 142, and the upper solder resist layer 184 has a second opening O2 exposing a bonding pad region 144P of the second upper wiring layer 144. The land region 142L is provided as a region to land an external connection conductor 190 of the second lower wiring layer 142 that is the outermost wiring layer, and the bonding pad region 144P is provided as a region for electrical connection with one or more of the semiconductor chips 210. The lower solder resist layer 182 and the upper solder resist layer 184 protect the first lower wiring layer 112, the second lower wiring layer 142, the first upper wiring layer 114, and the second upper wiring layer 144. In particular, the lower solder resist layer 182 prevents a solder bridge from occurring between a plurality of the first opening O1 that are adjacent to each other.

In the present embodiment, the second lower wiring layer 142 also provides a test pad region 142P (refer to FIG. 2, for example), and with reference to FIG. 2, the first opening O1 may include an opening for exposing the test pad region 142P. Of course, the second upper wiring layer 144 may similarly provide a test pad region 142P exposed by the second opening O2. Here, the test pad region 142P refers to a pad used to test whether a wiring circuit of the package substrate 100 is defective using a probe or the like, after cutting into individual package substrates in the process of manufacturing a plurality of package substrates and before the semiconductor chips 210 are mounted.

A first plating layer 155a may be formed on the land region 142L provided by the outermost lower wiring layer (e.g., a second lower wiring layer 142), and a second plating layer 155b may be formed on the test pad region 142P and the bonding pad region 144P provided by the outermost upper wiring layer (e.g., a second upper wiring layer 144). For example, the first plating layer 155a and the second plating layer 155b may be formed of Ni/Au or Ni/Pd/Au. Regions in which the first plating layer 155a and the second plating layer 155b are formed may be defined by the first opening O1 and the second opening O2, respectively.

As shown in FIGS. 1 and 2, the lower solder resist layer 182 is removed from regions adjacent to both edges positioned to oppose each other on a bottom surface of the package substrate 100 to form the first open region OP1 and the second open region OP2 in which the lower insulating layer 122 is exposed. The first open region OP1 and the second opening region OP2 may extend along corresponding edges to a predetermined length.

The package substrate 100 includes a plurality of support patterns 160 respectively arranged in the first open region OP1 and the second open region OP2. Each of the plurality of support patterns 160 extends from an end of the lower solder resist layer 182 to adjacent edges. The support patterns 160 employed in the present embodiment may be used as a reinforcing member supporting the package substrate 100 in the manufacturing process of the semiconductor package 300.

The first open region OP1 and the second open region OP2 are results remaining after an open region for removing a plating line is cut into individual semiconductor packages during the manufacturing process of the semiconductor package 300. This open region may be formed in a region between the package substrates in the panel (substrate structure) for a plurality of package substrates, and the plating lines exposed by the open region may be removed to separate a wiring circuit layer of the panel (substrate structure) in units of package substrates.

In this manner, by separating the wiring circuit in units of package substrates, defects of the wiring circuit may be inspected in units of package substrates before expensive semiconductor chips 210 are mounted. In the open region, severe bending may be induced by pressure applied in a subsequent package manufacturing process (e.g., a process of forming the mold part 280), causing cracks in the panel (substrate structure) (FIGS. 7 to 11 and see FIGS. 15A and 15B). By using the support patterns 160 employed in the present embodiment as a pre-formed reinforcing member in the open region, severe bending that may occur in a subsequent package manufacturing process may be effectively prevented.

Figure 3A:
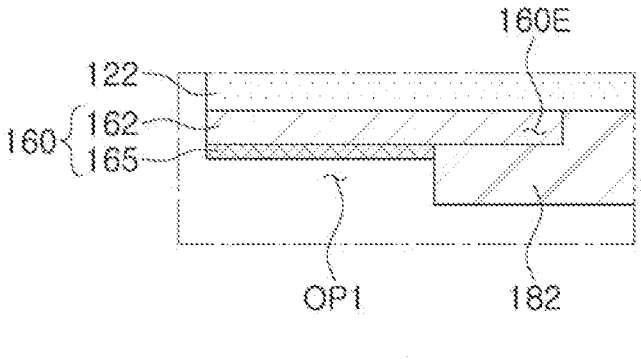
FIG. 3A is an enlarged partial cross-sectional view of portion "A1" of the semiconductor package of FIG. 1.
Figure 3B:
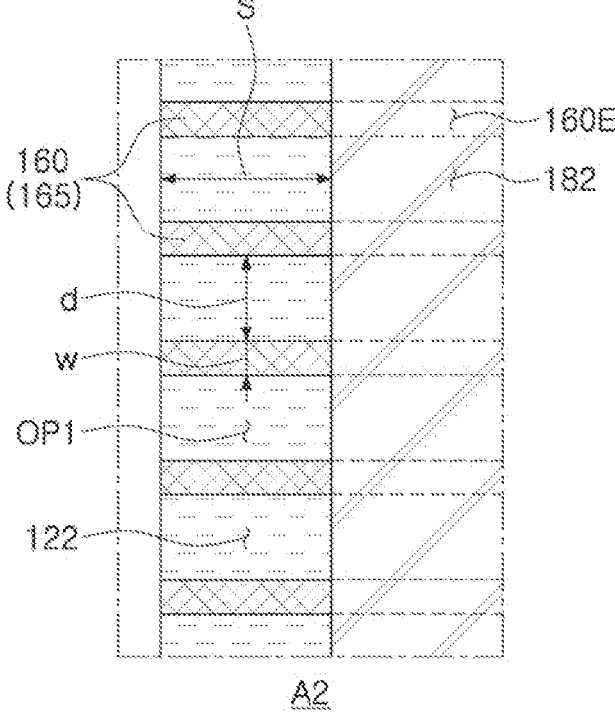
FIG. 3B is an enlarged partial plan view of portion "A2" of the semiconductor package of FIG. 2.

Referring to FIGS. 3A and 3B, the support patterns 160 using the reinforcing member extend in a width direction of the first open region OP1 and the second open region OP2, and has a portion positioned below the lower solder resist layer 182. The support patterns 160 may not be used as a part of the wiring circuit and may be electrically isolated from the first lower wiring layer 112, the second lower wiring layer 142, the first upper wiring layer 114, and the second upper wiring layer 144. In some embodiments, when the wiring circuit (e.g., the second lower wiring layer 142) includes a ground pattern, at least one of the support patterns 160 may be configured to be connected to the ground pattern.

Referring to FIG. 3A, the plurality of support patterns 160 may include the same metal layer 162 as the second lower wiring layer 142, and a protective layer 165 disposed in a portion exposed by the first open region OP1 and the second open region OP2 on the metal layer 162. In some embodiments, the protective layer 165 may be a plating layer, and in particular, the protective layer 165 may be a plating layer (this may be referred to as a 'protective plating layer') corresponding to the first plating layer 155a formed on the land region 142L or the test pad region 142P. For example, the protective layer 165, that is the protective plating layer, of the plurality of support patterns 160 may be Ni/Au or Ni/Pd/Au.

Referring to FIGS. 2 and 3B, the first open region OP1 and the second opening region OP2 may extend along corresponding edges to a predetermined length. In the present embodiment, the first open region OP1 and the second open region OP2 are respectively formed in a significant region of the corresponding edges, but may be formed in a partial region (e.g., a third open region OP3 and a fourth open region OP4 of FIG. 5B). In addition, the first open region OP1 and the second open region OP2 may have a constant width S in a direction, perpendicular to an extending direction. For example, the width S of each of the first open region OP1 and the second open region OP2 may be within a range of 50 μm to 250 μm.

Figure 7:
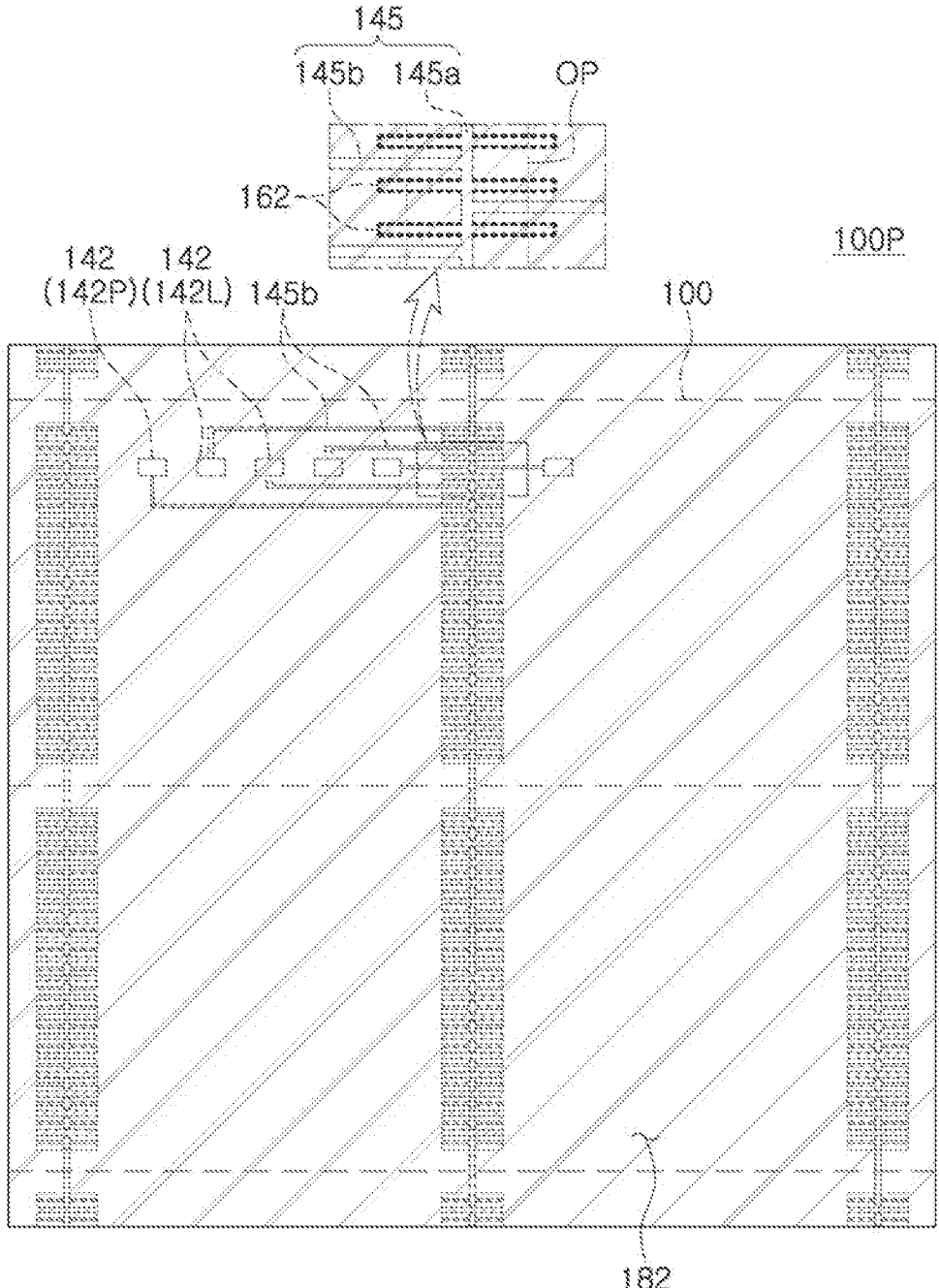
FIG. 7 is a bottom view illustrating a process of a method of manufacturing a package substrate according to an embodiment of the present disclosure.

A width w of the plurality of support patterns 160 may be equal to or greater than widths of the wiring circuit and the plating line (a plating line 145 of FIG. 7). For example, the width w of each of the plurality of support patterns 160 may be within a range of 10 μm to 1000 μm. The plurality of support patterns 160 are advantageously arranged at a narrow interval d from the viewpoint of reinforcement unless there are other design limitations. For example, the interval d between the plurality of support patterns 160 may be 200 μm or less, and in some embodiments, 100 μm or less.

The first open region OP1 may be arranged symmetrically with respect to the second open region OP2 and a center line of both edges. In some embodiments, in the case of a structure obtained with one open region (refer to open region OP of FIG. 11) across opposite edges of an adjacent package substrate 100 in a panel (refer to panel 100P of FIG. 11), the first open region OP1 and the second open region OP2 may be symmetrically disposed. In addition, the support patterns 160 of the first open region OP1 and the second open region OP2 may also be arranged symmetrically.

The plurality of semiconductor chips 210 disposed on the package substrate 100 may have a stacked structure. The plurality of semiconductor chips 210 may be bonded to each other by a plurality of bonding layers 220, and the lowermost one of the semiconductor chips 210 may be fixed on the package substrate 100 using one of the bonding layers 220. The plurality of semiconductor chips 210 may be of the same type or of different types. For example, all of the plurality of semiconductor chips 210 may be memory chips. In the present embodiment, eight semiconductor chips 210 are illustrated, but the number of semiconductor chips 210 is not limited thereto and may have a singular number or other numbers. In some embodiments, the stacked semiconductor chips 210 may be a high bandwidth memory (HBM).

The plurality of semiconductor chips 210 may be sequentially offset to expose the chip pads 215. The plurality of semiconductor chips 210 may be connected to each other through wires 250, and may be connected to a respective bonding pad region 144P (e.g., a bonding pad), from among a plurality of bonding pad regions, disposed on the package substrate 100.

The semiconductor package 300 may include a memory chip or another semiconductor chip such as a processor chip. The memory chip may be a volatile memory chip and/or a non-volatile memory chip. For example, the volatile memory chip may include dynamic random access memory (DRAM), static RAM (SRAM), thyristor RAM (TRAM), zero capacitor RAM (ZRAM), or twin transistor RAM (TTRAM). In addition, non-volatile memory chips may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, nano floating gate memory, holographic memory, molecular electronics memory, or insulator resistance change memory. In addition, the processor chip may include, for example, a microprocessor, a graphic processor, a signal processor, a network processor, a chipset, an audio codec, a video codec, an application processor, or a system on a chip, but is not limited thereto and the processor chip may be a control chip for driving a memory chip.

The mold part 280 may serve to protect the semiconductor chips 210 and the wires 250 from the outside. For example, the mold part 280 may be formed by injecting an appropriate amount of uncured resin onto the panel for a plurality of the package substrate 100 and curing the resin in a state in which a significant pressure is applied thereto. Here, a delay time between injection of the molding resin and pressing, the amount of the injection molding resin, and process conditions such as pressing temperature/pressure may be set in consideration of physical properties such as viscosity of the molding resin. For example, the mold part 280 may include an epoxy-group molding resin or a polyimide-group molding resin. For example, the mold part 280 may include an epoxy molding compound (EMC) or a high-K epoxy molding compound.

The semiconductor package 300 may further include an external connection conductor 190 disposed on the lower solder resist layer 182 and disposed in each land region 142L. The external connection conductor 190 physically and/or electrically connects the semiconductor package 300 to the outside. For example, the semiconductor package 300 may be mounted on a main board through the external connection conductor 190. The external connection conductor 190 may be formed of a conductive material, a low-melting-point metal, for example, tin (Sn) or an alloy containing tin (Sn), and more specifically, may be formed of solder or the like. The number, interval, arrangement, and the like of the external connection conductor 190 are not particularly limited, and may be sufficiently modified by a skilled person in the art according to various embodiments.

Figure 4A:
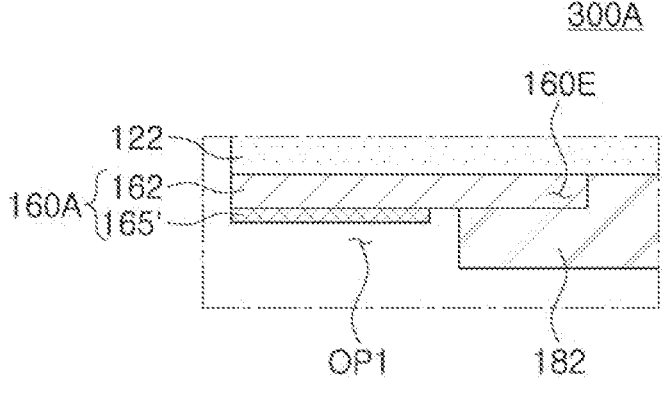
FIG. 4A is a partially enlarged view of a semiconductor package according to an embodiment of the present disclosure.
Figure 4B:
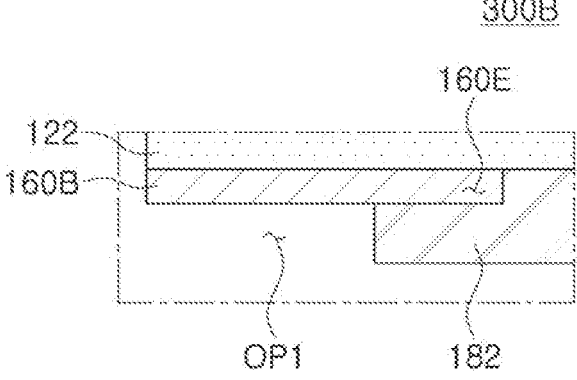
FIG. 4B is a partially enlarged view of a semiconductor package according to an embodiment of the present disclosure.

FIGS. 4A and 4B are partially enlarged views of a semiconductor package according to various embodiments of the present disclosure. FIGS. 4A and 4B are partially enlarged views of a semiconductor package 300A and a semiconductor package 300B according to various embodiments and may be understood as a cross-section corresponding to an enlarged portion (FIG. 3A) of a region "A1" of FIG. 1.

Referring to FIG. 4A, a semiconductor package 300A according to the present example embodiment may be understood as having a structure similar to that of the embodiment illustrated in FIGS. 1 to 3B, except that a protective plating layer 165' of a support pattern 160A is formed only on a partial region of a portion of the metal layer 162 that is exposed to the first open region OP1. Accordingly, the description of the embodiment shown in FIGS. 1 to 3B may be combined with the description of the present embodiment unless otherwise specifically stated.

The support pattern 160A employed in the present embodiment includes a metal layer 162 and a protective plating layer 165' disposed on a portion of the metal layer 162 that is exposed to the first open region OP1, similarly to the previous embodiment. However, unlike the previous embodiment, the support pattern 160A may not be formed in the entire open portion of the open region OP, but may be formed in only a partial region. In particular, the protective plating layer 165' may not be formed on a partial region of the metal layer 162 that is adjacent to the lower solder resist layer 182. This structure may be obtained when the width of the open region (open region OP in FIG. 10) for separating the wiring circuit is formed to be larger than the width of the opening (third open region O3 in FIG. 8) forming the protective plating layer 165'.

Referring to FIG. 4B, the semiconductor package 300B according to the present embodiment may be understood as having a structure similar to the embodiment shown in FIGS. 1 to 3B, except that a second support pattern 160B is formed of only a metal layer. Accordingly, the description of the embodiment shown in FIGS. 1 to 3B may be combined with the description of the present embodiment unless otherwise specifically stated.

Unlike the previous embodiment, the second support pattern 160B employed in the present embodiment may be formed of only a metal layer that is the same as the metal layer of the second lower wiring layer 142. The present embodiment may be implemented by omitting the process of forming the third opening O3 in the process illustrated in FIG. 8 in processes to be described later.

Figure 5A:
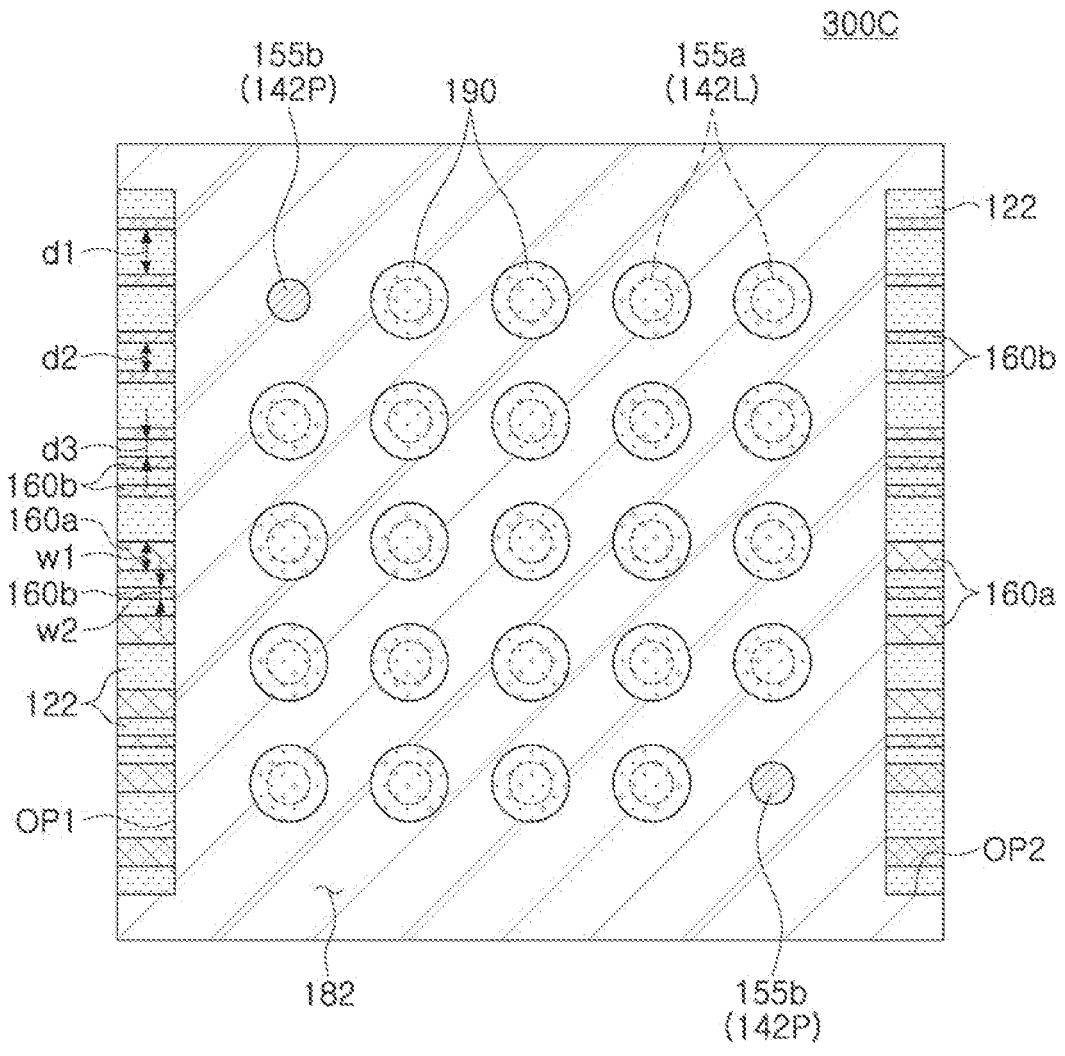
FIG. 5A is a bottom view of a semiconductor package according to an embodiment of the present disclosure.
Figure 5B:
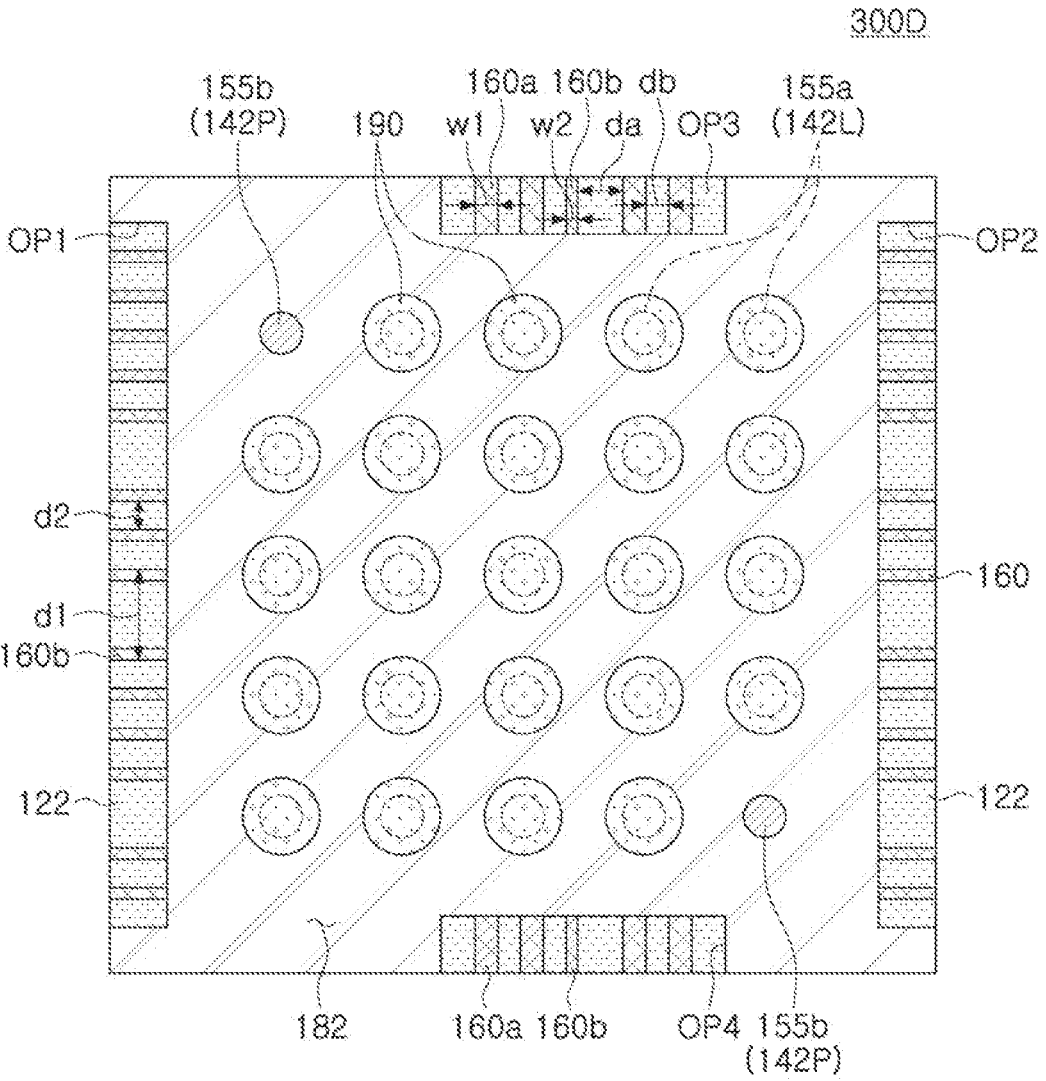
FIG. 5B is a bottom view of a semiconductor package according to an embodiment of the present disclosure.

FIGS. 5A and 5B are bottom views of a semiconductor package according to various embodiments of the present disclosure, respectively. FIGS. 5A and 5B are partially enlarged views of a semiconductor package 300C and a semiconductor package 300D according to various embodiments, and may be understood as a bottom surface of the semiconductor package (or package substrate) of FIG. 2.

Referring to FIG. 5A, the semiconductor package 300C according to the present embodiment may be understood as having a structure similar to that of the embodiment illustrated in FIGS. 1 to 3B, except that the first support pattern 160a and the second support pattern 160b having different widths (e.g., a first width w1 and a second width w2) are arranged at different intervals (e.g. a first interval d1, a second interval d2, and a third interval d3). Accordingly, the description of the embodiment shown in FIGS. 1 to 3B may be combined with the description of the present embodiment unless otherwise specifically stated.

The support pattern employed in the present embodiment includes the first support pattern 160a having a first width w1 and a second support pattern 160b having a second width w2 less than the first width w1 in each of the first open region OP1 and the second open region OP2. Also, the first support pattern 160a and the second support pattern 160b may be arranged at different intervals (first interval d1>second interval d2>third interval d3).

The first support pattern 160a and the second support pattern 160b are disposed by utilizing a space between the plating lines (in particular, the connection lines (connection line 145b in FIG. 7), and thus, as in the present embodiment, the plurality of support patterns may include support patterns having different widths or support patterns arranged at different intervals.

Referring to FIG. 5B, the semiconductor package 300D according to the present embodiment may be understood as having a structure similar to that of the embodiment illustrated in FIGS. 1 to 3B, except that third open region OP3 and the fourth open region OP4, in which the first support pattern 160a and the second support pattern 160b are arranged, are added to other facing edges and that the widths and arrangement intervals of the first support pattern 160a, the second support pattern 160b, and the support patterns 160 are different. Accordingly, the description of the embodiment shown in FIGS. 1 to 3B may be combined with the description of the present embodiment unless otherwise specifically stated.

In the semiconductor package according to the present embodiment, the first second open region OP1 and the second open region OP2 are arranged in regions adjacent to edges facing away from each other, respectively, and the third open region OP3 and the fourth open region OP4 are arranged in regions adjacent to other edges facing away from other, respectively. The third open region OP3 and the fourth open region OP4 are formed only in a partial region, and may have lengths different from the lengths of the first open region OP1 and the second open region OP2.

The plurality of the support pattern 160 positioned in the first open region OP1 and the second open region OP2 may have the same width and may be arranged at different intervals (e.g., a first interval d1 and a second interval d2). Meanwhile, the plurality of the first support pattern 160a and the plurality of the second support pattern 160b positioned in the first open region OP1 and the second open region OP2 may have different widths (e.g. a first width w1 and a second width w2) and may be arranged at different intervals da and db.

FIG. 6 is a flowchart illustrating a method of manufacturing a semiconductor package according to an embodiment of the present disclosure.

A method of manufacturing a semiconductor package according to the present embodiment includes a manufacturing process of a package substrate. The manufacturing process of the package substrate may be performed as a process of manufacturing a panel having a plurality of package substrates (panel 100P in FIG. 7).

Referring to FIG. 6, in the manufacturing process of the package substrate, a substrate structure having a plurality of substrate regions is prepared (S11), and an upper wiring layer and a lower wiring layer, which are outermost wiring layers, are formed on both surfaces of each of the plurality of substrate regions (S12). Here, the upper wiring layer may be formed to include a bonding pad region and a test pad region, and the lower wiring layer may be formed to include land regions and a test pad region. In addition, when the lower wiring layer is formed, a plating line and a support pattern may be additionally formed in a region between the substrate regions on the lower surface of the substrate structure.

Next, in operation S14, an upper solder resist layer and a lower solder resist layer are formed on both surfaces of the substrate structure to cover the upper wiring layer and the lower wiring layer, respectively. The lower solder resist layer is formed to cover the plating line and the support pattern, together, positioned in a region between the substrate regions (refer to FIG. 7). Next, a first opening for land regions and test pad regions is formed in the lower solder resist layer, and a second opening for exposing bonding pad regions and test pad regions is formed in the upper solder resist layer. In this process, a third opening exposing the support pattern is also formed in the lower solder resist layer (refer to FIG. 8).

Subsequently, in operation S15, a plating layer may be formed on the land regions, the test pad regions, the bonding pad regions, and the support pattern using a plating line. The present plating process may be collectively performed using a plating line electrically connected to the upper and lower wiring layers of the plurality of substrate regions. In this process, as in the previous embodiments (FIGS. 1 to 3B), a first plating layer may be formed on the land region and the test pad region, a second plating layer may be formed on the bonding pad regions, and a protective plating layer may be formed in the support pattern. The protective plating layer may include the same material as the first plating layer (refer to FIG. 9).

Next, in operation S16, an open region may be formed in the lower solder resist layer region between the plurality of substrate regions. A partial region of the plating line and support patterns may be exposed through the open region (refer to FIG. 10). Next, in operation S18, the portions of the plating line exposed by the open region may be selectively removed. By removing the exposed portion of the plating line, the wiring circuits of the respective substrate regions connected to each other for plating may be separated into individual package substrate units. Meanwhile, in the selective removal process, the support patterns may be protected by a mask pattern, so that the support patterns may remain in the open region even after the exposed portions of the plating line are removed (refer to FIGS. 11 and 12).

Subsequently, in operation S21, a test may be performed to determine whether a wiring circuit in each substrate area is defective using the test pads. By inspecting whether the package substrate is defective before mounting the semiconductor chip, unnecessary loss of the semiconductor chip may be prevented. The test pads used in this process may be formed in the upper wiring layer as well as the lower wiring layer.

Figure 13:
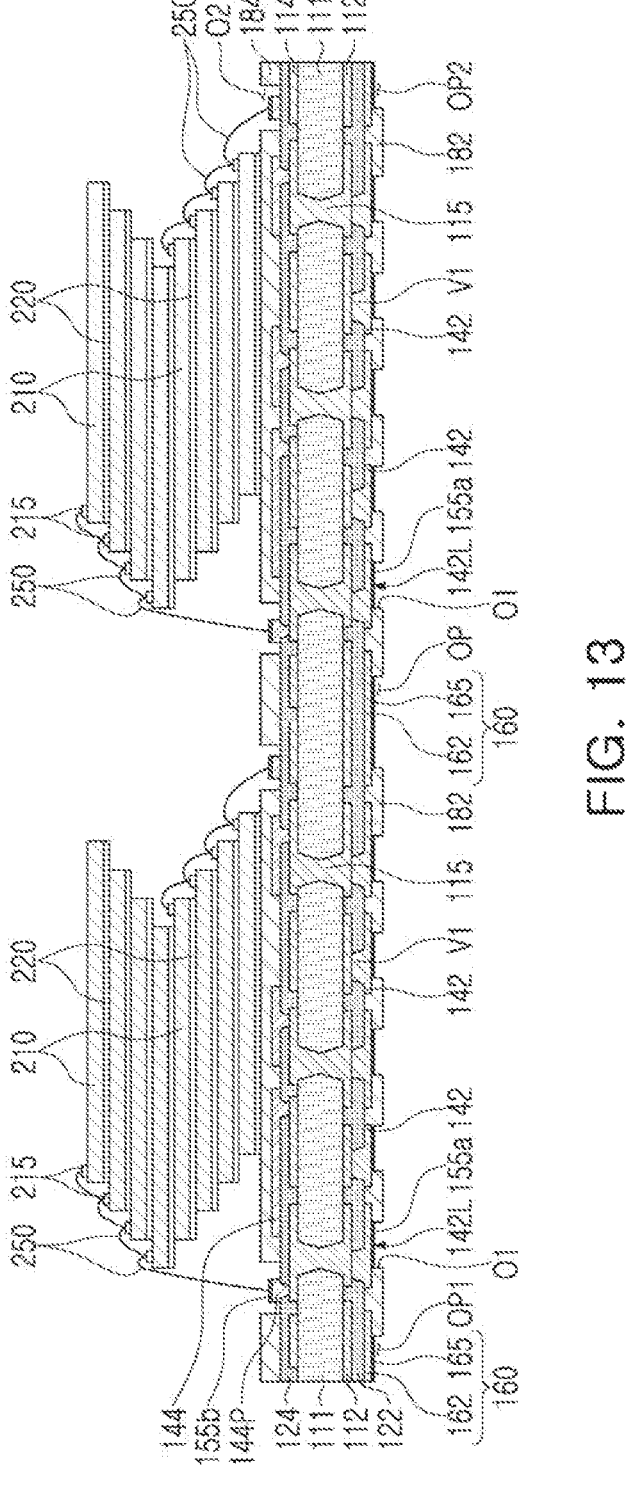
FIG. 13 is a cross-sectional view illustrating a process of the method of manufacturing the semiconductor package according to the embodiment of the present disclosure.

Next, in operation S22, a semiconductor chip may be mounted on each of the upper surfaces of the plurality of substrate regions, and the chip pad of the semiconductor chip and the bonding pad may be connected using a connection means (e.g., a wire or a solder ball) (FIG. 13). Next, in operation S24, a mold part (e.g., a molded portion) covering the semiconductor chip is formed on the upper surface of the substrate structure (or panel) (refer to FIG. 14). When forming the mold part, a high pressure may be applied to the substrate structure and the support patterns remain in the open regions from which the lower solder resist layer is removed, so that serious bending may be effectively suppressed. Subsequently, in operation S26, after the mold part is formed, the substrate structure in which the mold part is formed may be cut into a plurality of package units to manufacture a plurality of semiconductor packages.

The method of manufacturing the semiconductor package described above with reference to FIG. 6 may be described in more detail with reference to FIGS. 7 to 14. The method of manufacturing the semiconductor package shown in FIGS. 7 to 14 may be understood as a manufacturing process of the semiconductor package shown in FIG. 1.

Figure 10:
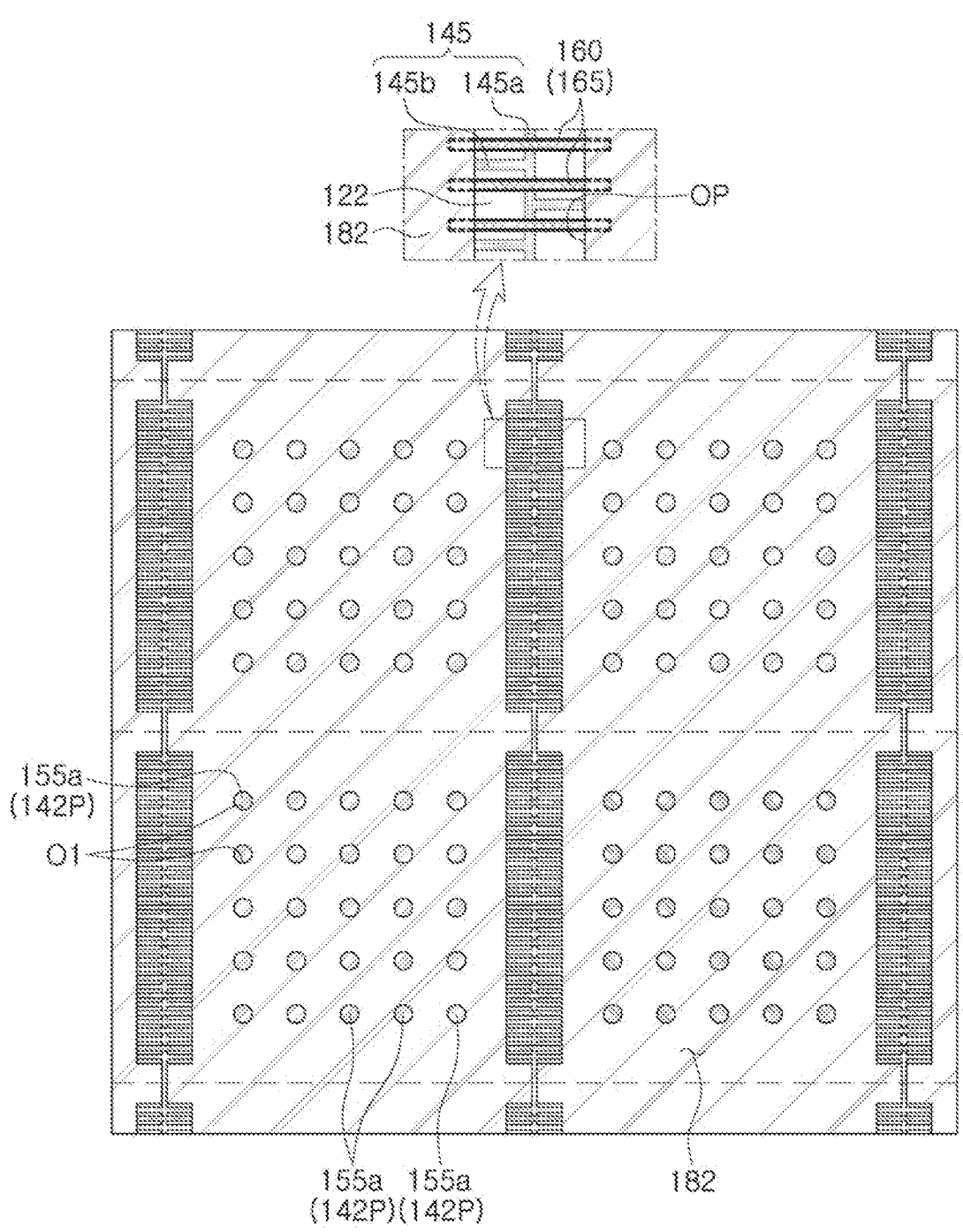
FIG. 10 is a bottom view illustrating a process of the method of manufacturing the package substrate according to the embodiment of the present disclosure.
Figure 11:
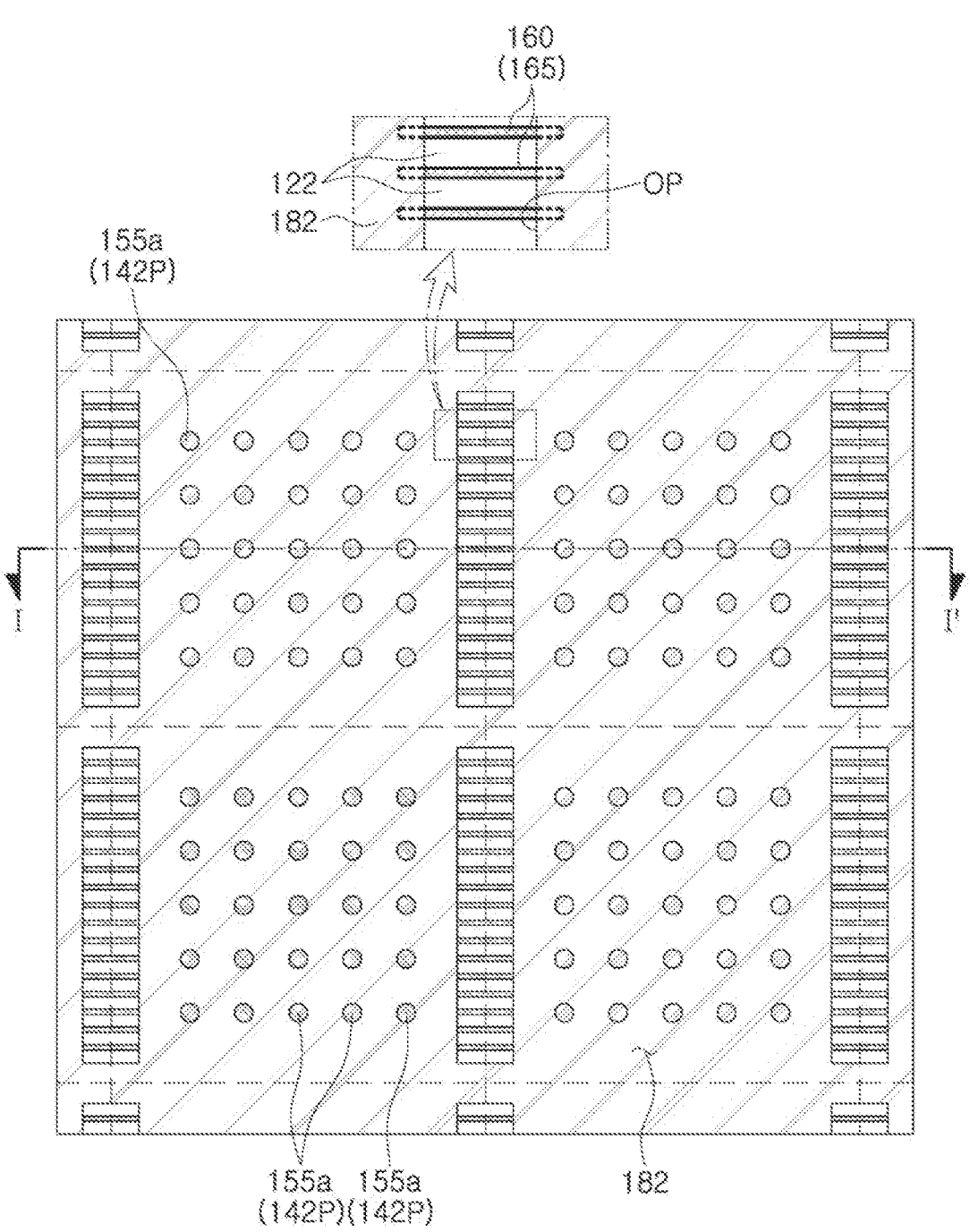
FIG. 11 is a bottom view illustrating a process of the method of manufacturing the package substrate according to the embodiment of the present disclosure.
Figure 12:
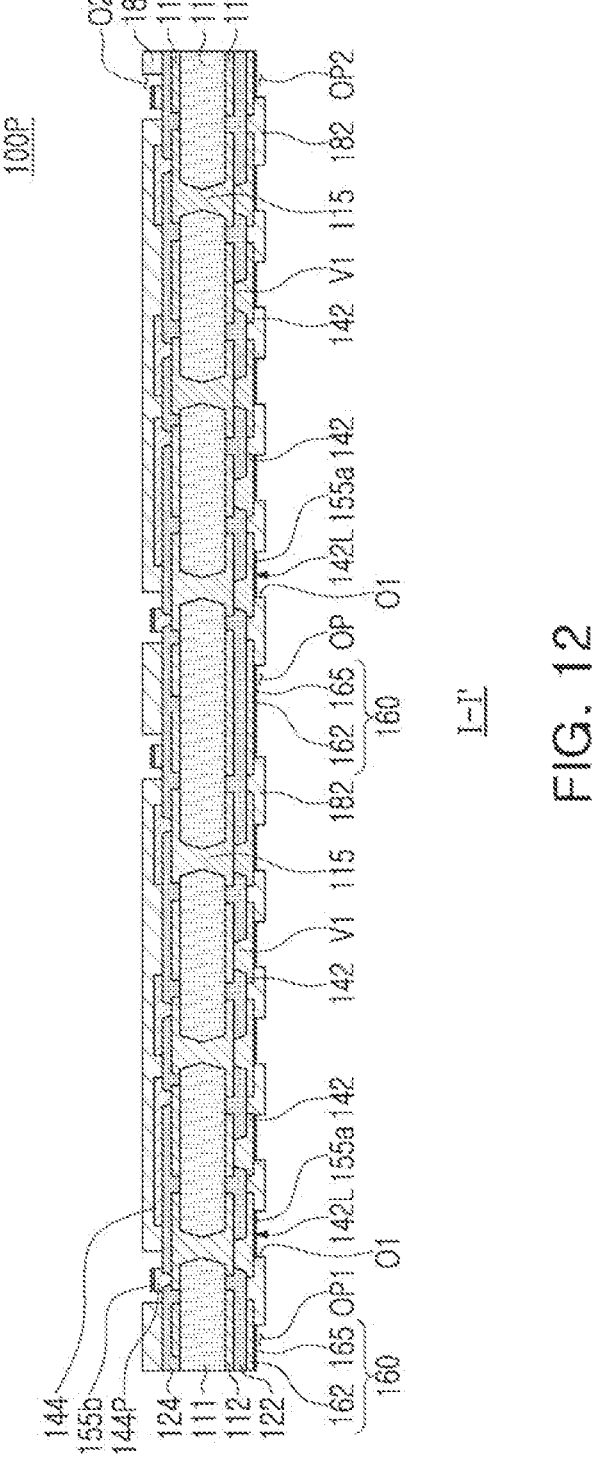
FIG. 12 is a cross-sectional view illustrating a process of a method of manufacturing a semiconductor package according to an embodiment of the present disclosure.
Figure 14:
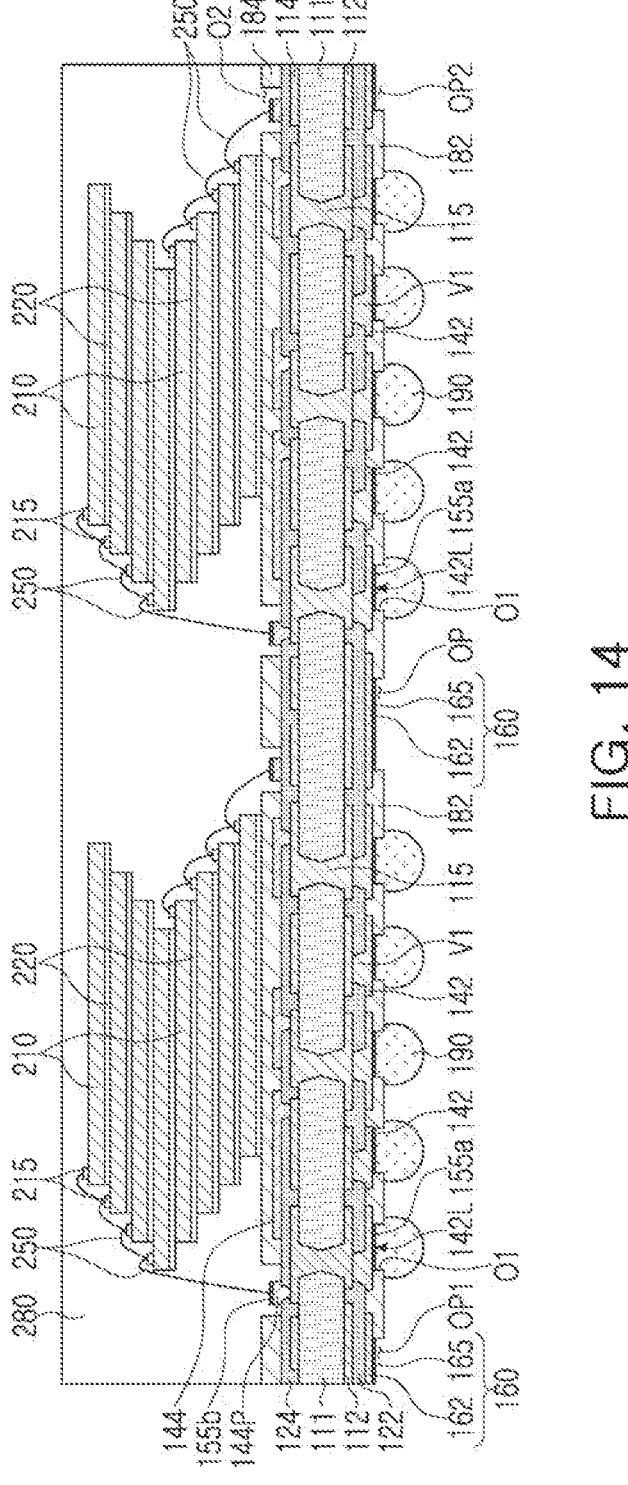
FIG. 14 is a cross-sectional view illustrating a process of the method of manufacturing the semiconductor package according to the embodiment of the present disclosure.

Here, FIGS. 7 to 11 are bottom views for a plurality of processes for explaining a method of manufacturing a package substrate, and FIGS. 12 to 14 are cross-sectional views for each of the plurality of processes for explaining a method of manufacturing a semiconductor package together with semiconductor chip mounting.

Referring to FIG. 7, a bottom surface (i.e., a lower surface) of a panel 100P for a plurality of the package substrate 100 is illustrated. A lower solder resist layer 182 is formed to cover the second lower wiring layer 142, the plating line 145, and the metal layer 162 (e.g., a supporting metal layer). Here, the second lower wiring layer 142, the plating line 145, and the metal layer 162 may be obtained by the same metal patterning process. The lower solder resist layer 182 may be formed together with the upper solder resist layer (upper solder resist layer 184 of FIG. 1).

The second lower wiring layer 142 may be formed in the same pattern on each of the plurality of the package substrate 100. In FIG. 7, a detailed arrangement of the second lower wiring layer 142 and the plating line 145 is illustrated with the dotted line only in a partial region of one package substrate (top left), but it may be understood as being formed over the entire region of each package substrate 100.

The second lower wiring layer 142 may include a circuit pattern having a land region 142L and a test pad region 142P. The plating line 145 may be a pattern employed for simultaneously forming a plating layer in the land regions and test regions to be plated in each package substrate. The plating line 145 may be formed in a region between the plurality of the package substrate 100 on the lower insulating layer 122 on which the outermost lower wiring layer (e.g., the second lower wiring layer 142) is formed.

In the present embodiment, the plating line 145 may include a bus line 145a, formed along a region of the lower insulating layer 122 between the plurality of the package substrate 100, and the connection lines connecting the plurality of the land region 142L and plurality of the test pad region 142P to be plated to the bus line 145a.

In addition, the metal layer 162 may be formed to cross the bus line in the region between the plurality of the package substrate 100. Even after an open region OP (indicated by the dotted line) is formed in a subsequent process, the metal layer 162 may have a length such that both ends thereof are covered by the remaining lower solder resist layer 182.

Figure 8:
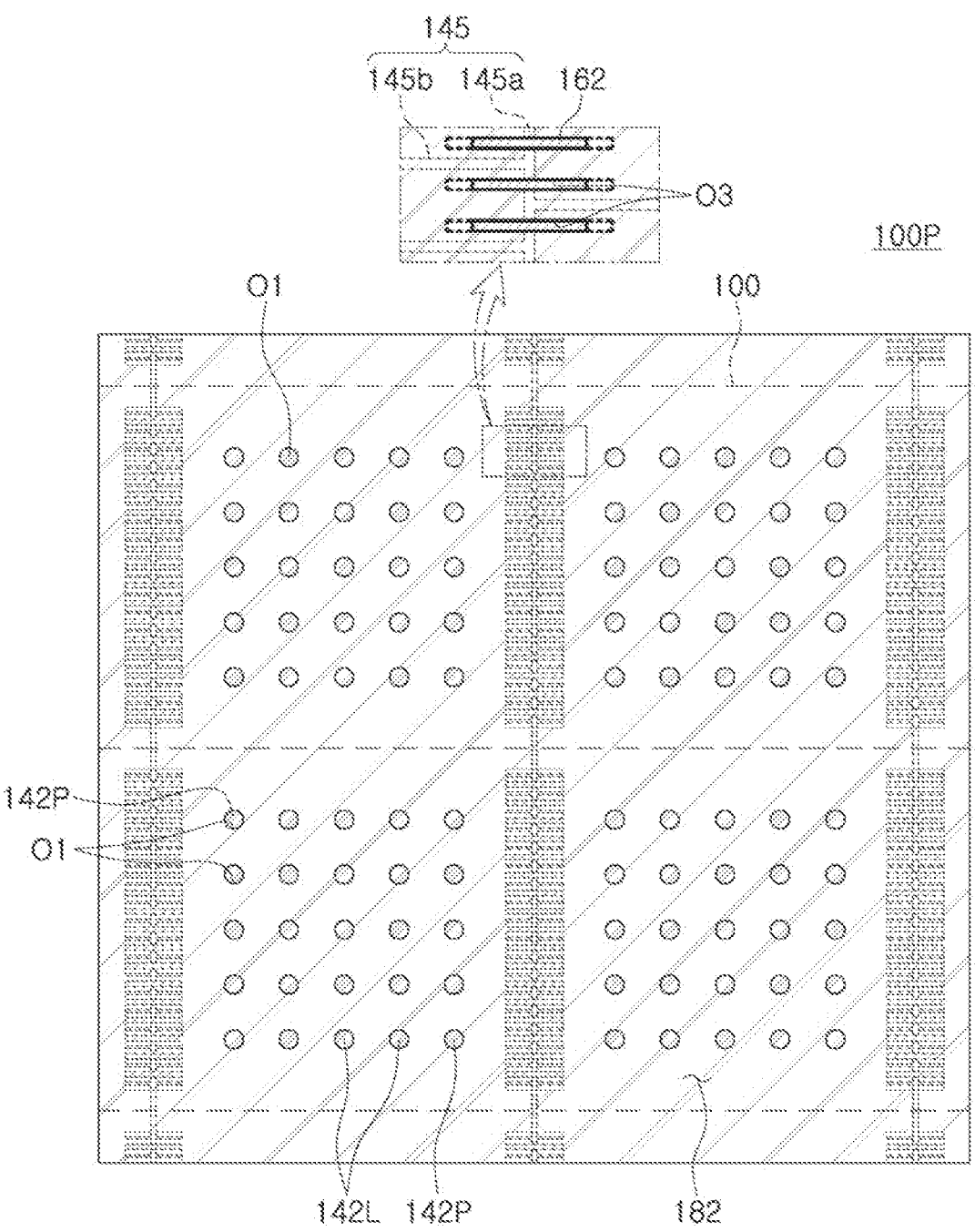
FIG. 8 is a bottom view illustrating a process of the method of manufacturing the package substrate according to the embodiment of the present disclosure.

Referring to FIG. 8, a plurality of a first opening O1 for a plurality of the land region 142L and the plurality of the test pad region 142P is formed in the lower solder resist layer 182, and in this process, a plurality of a third opening O3 exposing a partial region of the metal layer 162 (a region excluding both end regions) is formed. Although not shown, in the present process, a second opening exposing bonding pad regions and test pad regions may be formed in the upper solder resist layer (refer to FIGS. 1 and 11). Two pads diagonally positioned in each package substrate 100 may be provided as the test pad region 142P.

Figure 9:
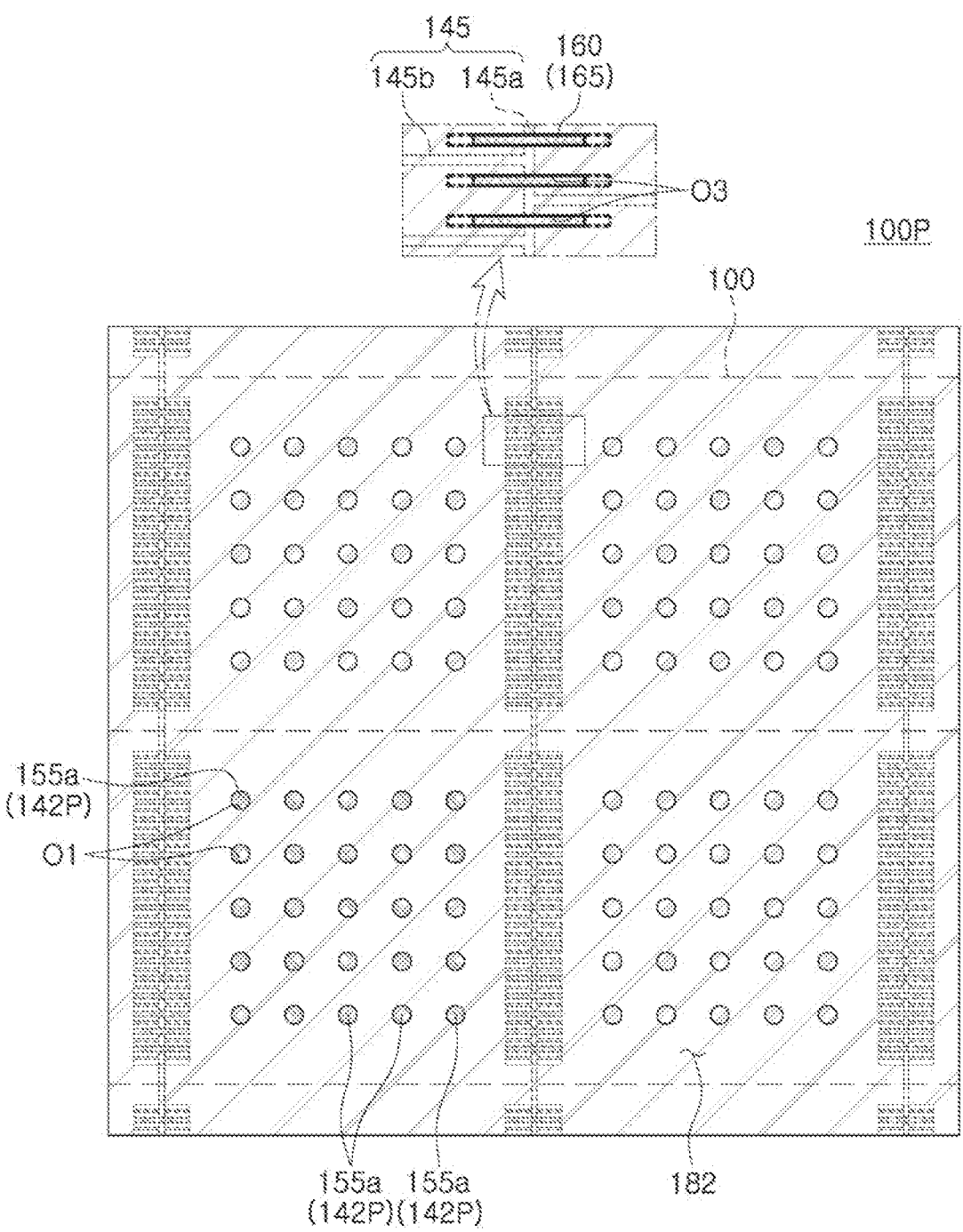
FIG. 9 is a bottom view illustrating a process of the method of manufacturing the package substrate according to the embodiment of the present disclosure.

Next, referring to FIG. 9, a first plating layer 155a and a protective layer 165 may be simultaneously formed on the plurality of the land region 142L, the plurality of the test pad region 142P, and the second lower wiring layer 142 (e.g., a metal layer) disposed on each package substrate 100 using the plating line 145. The first plating layer 155a and the protective layer 165 may be the same plating layer. The present plating process may be collectively performed using a plating line electrically connected to the upper and lower wiring layers of each of the plurality of package substrates. Although not shown, in the present plating process, a second plating layer may be formed on the bonding pad region and the test pad regions defined by the second opening of the upper solder resist layer (refer to FIGS. 1 and 11).

Through this process, desired support patterns 160 may be formed by additionally forming the protective layer 165 on the exposed region of the metal layer 162.

After the plating process is finished, a process of separating the wiring circuits implemented on the plurality of package substrate 100 is performed.

First, referring to FIG. 10, an open region OP may be formed in a region of the lower solder resist layer 182 between the plurality of the package substrate 100. The plating line 145 to be removed by the open region OP may be exposed. The bus line 145a is exposed almost entirely, but only a portion of the connection line 145b adjacent to the bus line 145a may be exposed, and the other remaining region (a region positioned below the lower solder resist layer in FIG. 10) may remain separated from the wiring circuit of the other package substrate 100.

The open region OP formed in this process may be formed to include a plurality of the third opening O3 exposing a portion of the support patterns 160. Also, the open region OP may be formed to overlap partial regions of two package substrates, from among the plurality of the package substrate 100, adjacent to each other with respect to a scribe lane.

Next, referring to FIG. 11, portions of the plating line 145 exposed by the open region OP may be selectively removed. The selective removal process may be performed as a wet etching process for removing a metal pattern such as Cu. By selectively removing the exposed portion of the plating line 145, the wiring circuit of each package substrate 100 connected to each other for plating, such as the plurality of the land region 142L, may be separated into individual package substrate units.

Meanwhile, a mask pattern for protecting the support patterns 160 and the land region 142L may be formed prior to the selective removal process. Accordingly, through the selective removal process, the exposed portion of the plating line may be removed from the open region OP, but the support patterns 160 may remain. Since the support patterns 160 remain in the open region OP even after the selective removal process, the open region OP weakened by the removal of the lower solder resist layer 182 and the plating line 145 may be structurally strengthened.

In this manner, after the wiring circuit is separated for each package substrate, whether the wiring circuit of the individual package substrate is defective may be tested using the plurality of the test pad region 142P (e.g., test pads) on which the first plating layer 155a is formed. By inspecting whether the package substrate is defective before mounting the semiconductor chip, unnecessary loss of the semiconductor chip may be prevented. The test pads used in this process may also be formed on the upper wiring layer as well as on the lower wiring layer.

Referring to FIG. 12, a cross-section of the panel 100P shown in FIG. 11 taken along line I-I' is illustrated. As shown in FIG. 13, the semiconductor chips 210 are stacked and mounted on the package substrate 100 on which the inspection is completed in the panel 100P. The semiconductor chips 210 may be stacked so that the chip pads 215 are offset to be exposed upwardly. The exposed chip pads 215 may be connected to the bonding pad regions 144P using wires 250.

Next, referring to FIG. 14, a mold part 280 covering the semiconductor chips 210 and the wires 250 may be formed on an upper surface of the panel 100P. When the mold part 280 is formed, a high pressure may be applied to the panel 100P and the plurality of the support pattern 160 remain in the open region OP from which the lower solder resist layer 182 is removed, so that serious bending may be effectively suppressed.

Figure 15A:
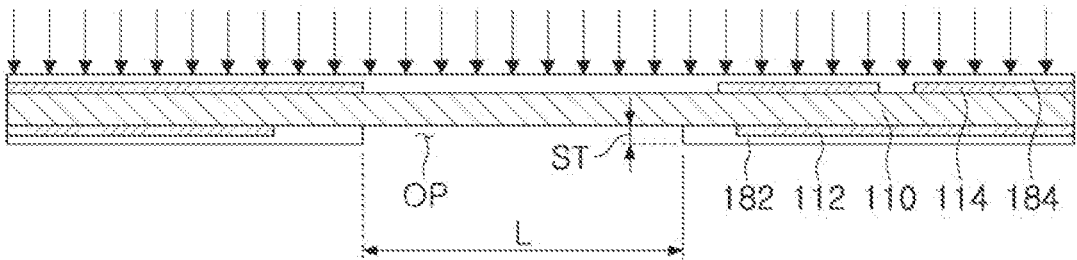
FIG. 15A is a first schematic side cross-sectional view illustrating a substrate structure before being bent by a pressure applied when forming a mold part.
Figure 15B:
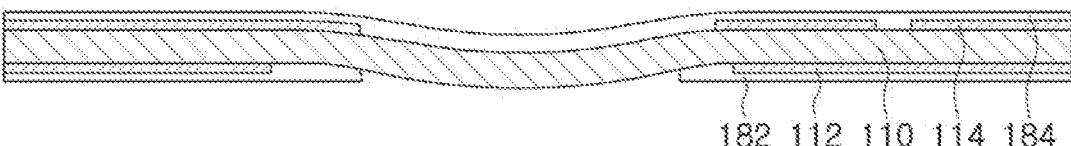
FIG. 15B is a second schematic side cross-sectional view illustrating a substrate structure bent by the pressure applied when forming the mold part.

FIGS. 15A and 15B are schematic side cross-sectional views illustrating a substrate structure that is bent by pressure applied when forming a mold part.

Referring to FIG. 15A, a substrate structure having lower and upper wiring layers on upper and lower surfaces of the substrate body 110, in which the lower and upper wiring layers are respectively covered with lower and upper solder resist layers, is illustrated. Similar to the panel illustrated in FIG. 14, the substrate structure has an open region OP from which a partial region of the lower solder resist layer 182 is removed, and unlike other regions, the first lower wiring layer 112 does not remain. As a result, there is a thin region having a constant step difference, compared with other regions, and severe bending may occur in the structurally weak open region when a significant pressure is applied to the upper surface (marked by the arrow), such as in the mold part forming process. In the bending region, cracks may occur between the layers, causing serious defects in the package substrate.

In contrast, in the package substrate according to the present embodiment, the plurality of the support pattern 160 remains in the plurality of the open region OP from which the lower solder resist layer 182 is removed, thereby resolving a step difference to a certain extent, and is used as a reinforcing material to alleviate severe bending and prevent severe defects such as cracks.

Finally, after the mold part 280 is formed, the panel 110P on which the mold part 280 is formed may be cut (refer to, for example, the scribe lane SL in FIG. 16) to manufacture a plurality of the semiconductor package 300.

Figure 16:
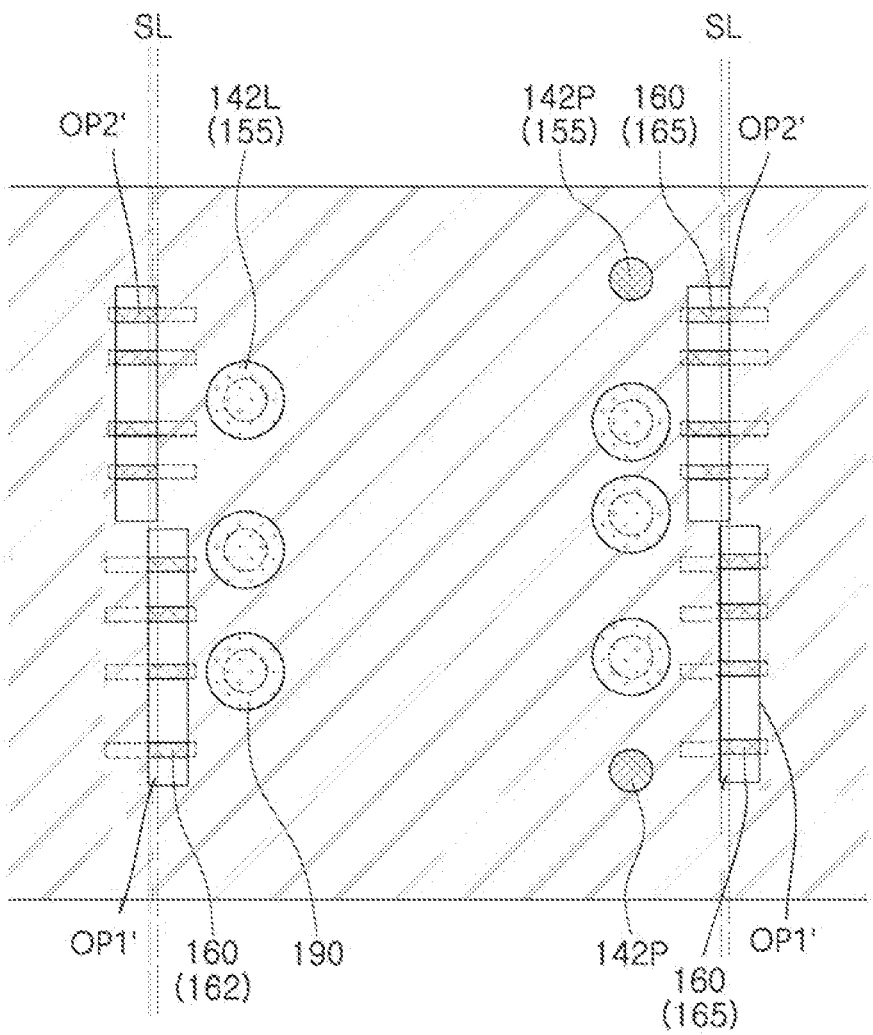
FIG. 16 is a bottom view of a substrate structure according to an embodiment of the present disclosure.
Figure 17:
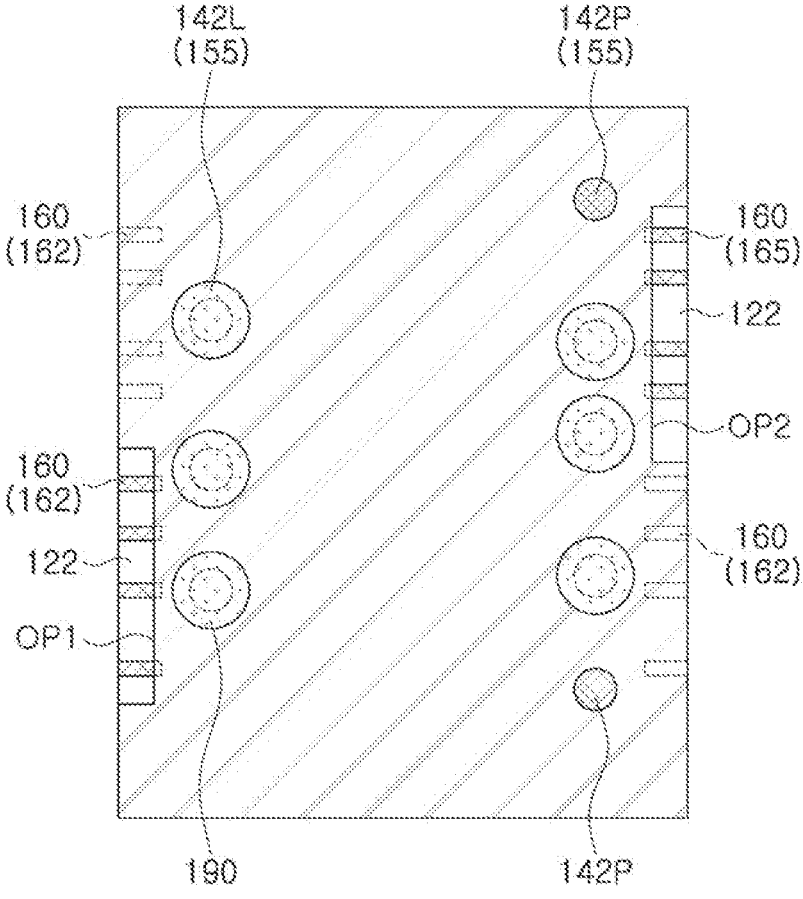
FIG. 17 is a bottom view of a semiconductor package, after the substrate structure of FIG. 16 is cut.

FIG. 16 is a bottom view of a substrate structure according to an embodiment of the present disclosure. FIG. 17 is a bottom view of a semiconductor package, after the substrate structure of FIG. 16 is cut, and FIG. 18 is a cross-sectional side view illustrating an open region applied to a package substrate of FIG. 17.

Figure 18:
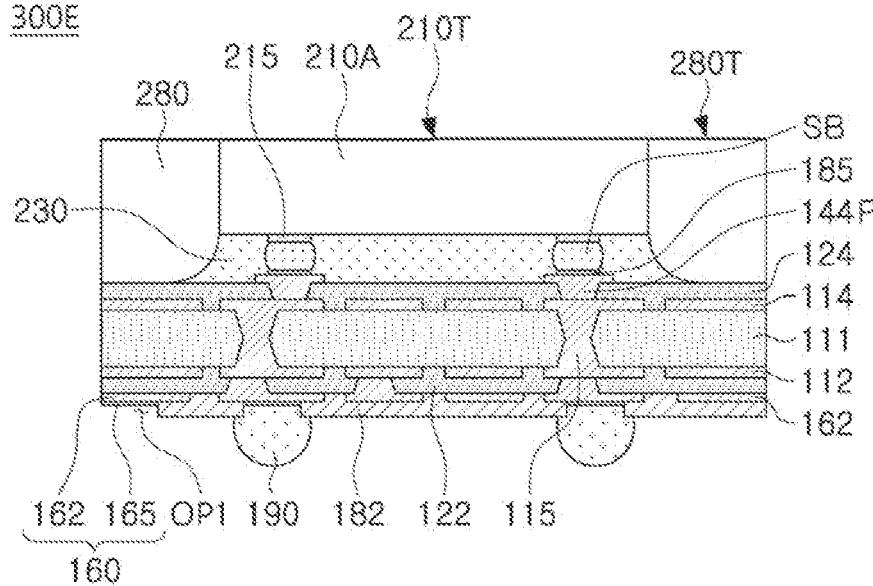
FIG. 18 is a cross-sectional side view illustrating an open region applied to a package substrate of FIG. 17.

Referring to FIGS. 16 to 18, a semiconductor package 300E according to the present embodiment may be understood as having a structure similar to the embodiment illustrated in FIGS. 1 to 3B, except that the semiconductor package 300E includes a flip chip-bonded semiconductor chip 210A, and that the first open regions OP1 and the second open region OP2 are introduced as a bilaterally asymmetrical array. Accordingly, the description of the embodiment shown in FIGS. 1 to 3B may be combined with the description of the present embodiment unless otherwise specifically stated.

The semiconductor chip 210A may be bonded to the package substrate 100 using conductive bumps SB. The conductive bumps SB may connect a plurality of the bonding pad region 144P (e.g., bonding pads) arranged on the top surface of the package substrate 100 and the chip pads 215 of the semiconductor chip 210A.

Similar to the previous embodiment, the package substrate 100 has a first open region OP1 and a second open region OP2 adjacent to edges of opposite sides of the package substrate 100, and a plurality of the support pattern 160 may be arranged in the first open region OP1 and the second open region OP2. Referring to FIG. 17, unlike the previous example embodiments, the first open region OP1 and the second open region OP2 may be disposed asymmetrically to each other. Specifically, the first open region OP1 may be positioned adjacent to a lower portion of the corresponding edge to which the first open region OP1 is adjacent, and the second open region OP2 may be positioned adjacent to an upper portion of the corresponding edge to which the second open region OP2 is adjacent. Such an arrangement may be obtained by an open region arrangement at a panel level, as shown in FIG. 16.

Referring to FIG. 16, the first open region OP1' and the second open region OP2' positioned in a region connecting adjacent ones of the plurality of the package substrate 100 may be arranged in a zigzag manner. The first open regions OP1' and the second open region OP2' may be configured to be very close or connected, and may be arranged to partially overlap in the vertical direction so that the bus line 145a of FIG. 7 is almost completely removed. The overlapping region may be removed during a cutting process along a scribe lane SL, and after being cut, as shown in FIG. 17, the first open region OP1 and the second open region OP2 adjacent to the two facing edges may be formed asymmetrically. Through this arrangement, a total area of the first open regions OP1 and the second open region OP2' may be reduced, and as a result, structural weakness may be alleviated. In addition, since the support patterns 160 described in the previous embodiment is additionally formed as a reinforcing material in the first open region OP1' and the second open region OP2', vulnerability of bending may be more effectively resolved.

In the present embodiment, a top surface 210T of the semiconductor chip 210A may be exposed through a top surface 280T of the mold part 280. Such a structure may be advantageous for heat dissipation. Also, the top surface 210T of the semiconductor chip 210A may have a substantially flat coplanar surface with the top surface 280T of the mold part 280. This process may be obtained through an additional polishing process after forming the mold part 280.

As set forth above, in the manufacturing process of a semiconductor package, the support pattern is formed in advance in the open region for separating the wiring circuit layer of the panel (substrate structure) for a plurality of package substrates in a package substrate unit, and when the plating line is removed after the open region is formed, the support pattern remains to be used as a reinforcing member, thereby preventing serous bending of the open region due to pressure applied when the mold part is formed.

While non-limiting example embodiments have been shown and described above, it will be apparent to those skilled in the art that modifications and variations could be made without departing from the scope of the present disclosure.

What is claimed is:

1. A semiconductor package comprising:
   a package substrate comprising:
      a substrate body;
      a lower wiring layer on a lower surface of the substrate body and comprising a land region;
      an upper wiring layer on an upper surface of the substrate body and electrically connected to the lower wiring layer; and
      a solder resist layer on the lower surface of the substrate body and that includes an opening that exposes the land region of the lower wiring layer;
   a semiconductor chip on the package substrate and comprising a plurality of contact pads electrically connected to the upper wiring layer; and
   a mold part on the package substrate and that seals the semiconductor chip,
   wherein the package substrate further comprises:
      at least one open region defined by a portion of a bottom surface of the package substrate on which the solder resist layer is not present and that is adjacent to at least one edge of the package substrate on the bottom surface of the package substrate, and
      a plurality of support patterns in the at least one open region and that extend, in a horizontal direction, from an end of the solder resist layer in the horizontal direction to the at least one edge.

2. The semiconductor package of claim 1, wherein the plurality of support patterns comprises a metal layer that is the same as a metal layer of the lower wiring layer.

3. The semiconductor package of claim 1, wherein the plurality of support patterns comprises a protective layer in the at least one open region.

4. The semiconductor package of claim 3, wherein
   the land region comprises a plating layer in a region of the lower wiring layer exposed by the opening, and
   the protective layer comprises a material layer that is the same as a material layer of the plating layer.

5. The semiconductor package of claim 1, wherein the plurality of support patterns are electrically isolated from the lower wiring layer and the upper wiring layer.

6. The semiconductor package of claim 1, wherein
the lower wiring layer comprises a ground pattern, and
the plurality of support patterns are connected to the ground pattern.

7. The semiconductor package of claim 1, wherein the plurality of support patterns comprises support patterns that have respective widths that are different from each other.

8. The semiconductor package of claim 1, wherein the plurality of support patterns comprises support patterns that are arranged at different intervals.

9. The semiconductor package of claim 1, wherein the plurality of support patterns have a width that is greater than or equal to 10 μm and less than or equal to 1000 μm.

10. The semiconductor package of claim 1, wherein the plurality of support patterns are arranged at an interval of 200 μm or less.

11. The semiconductor package of claim 10, wherein the interval of the plurality of support patterns is 100 μm or less.

12. The semiconductor package of claim 1, wherein the at least one open region comprises a first open region and a second open region, respectively at a first edge and a second edge of the package substrate that are opposite to each other.

13. The semiconductor package of claim 1, wherein
the substrate body comprises a core layer, and further comprises a lower insulating layer and an upper insulating layer respectively on a lower surface and an upper surface of the core layer,
the lower wiring layer comprises a first lower wiring layer on the lower surface of the core layer, and a second lower wiring layer on the lower insulating layer, and
the upper wiring layer comprises a first upper wiring layer on the upper surface of the core layer, and a second upper wiring layer on the upper insulating layer.

14. A semiconductor package comprising:
a package substrate;
a semiconductor chip on the package substrate; and
a mold part on the package substrate and that seals the semiconductor chip,
wherein the package substrate comprises:
a core layer comprising a lower surface and an upper surface;
a through-via that penetrates through the core layer from the lower surface of the core layer to the upper surface of the core layer;
a first lower wiring layer and a first upper wiring layer respectively on the lower surface of the core layer and the upper surface of the core layer, and connected to each other by the through-via;
a lower insulating layer and an upper insulating layer respectively on the lower surface of the core layer and the upper surface of the core layer, and on the first lower wiring layer and the first upper wiring layer, respectively;
a second lower wiring layer and a second upper wiring layer respectively on the lower insulating layer and the upper insulating layer, and connected to the first lower wiring layer and the first upper wiring layer, respectively;
a lower solder resist layer on the lower insulating layer such as to be on the second lower wiring layer, and including a first opening that exposes a land region of the second lower wiring layer; and
an upper solder resist layer on the upper insulating layer such as to be on the second upper wiring layer, and including second openings that expose bonding pad regions of the second upper wiring layer,
wherein the package substrate further comprises:
a first open region defined by a first portion of a bottom surface of the package substrate on which the lower solder resist layer is not present and that is adjacent to a first edge of the package substrate on the bottom surface of the package substrate;
a second open region defined by a second portion of the bottom surface of the package substrate on which the lower solder resist layer is not present and that is adjacent to a second edge of the package substrate on the bottom surface of the package substrate, the second edge opposite to the first edge;
a plurality of first support patterns arranged in the first open region and that extend, in a first horizontal direction, from a first end of the lower solder resist layer in the first horizontal direction to the first edge; and
a plurality of second support patterns arranged in the second open region and that extend, in a second horizontal direction, from a second end of the lower solder resist layer in the second horizontal direction to the second edge.

15. The semiconductor package of claim 14, wherein the first open region and the second open region are bilaterally symmetrical with respect to a virtual center line that is parallel with and between the first edge and the second edge.

16. The semiconductor package of claim 14, wherein the first open region and the second open region are asymmetrical with respect to a virtual center line that is parallel with and between the first end and the second end.

17. The semiconductor package of claim 14, wherein
the plurality of first support patterns comprises a metal layer, corresponding to the second lower wiring layer, and a plating layer in a region of the second lower wiring layer that is within the first open region, and
the plurality of second support patterns comprises a metal layer, corresponding to the second lower wiring layer, and a plating layer in a region of the second lower wiring layer that is within the second open region.

18. The semiconductor package of claim 14, wherein the package substrate further comprises:
a third open region defined by a third portion of the bottom surface of the package substrate on which the lower solder resist layer is not present and that is adjacent to a third edge of the package substrate on the bottom surface of the package substrate;
a fourth open region defined by a fourth portion of the bottom surface of the package substrate on which the lower solder resist layer is not present and that is adjacent to a fourth edge of the package substrate on the bottom surface of the package substrate, the fourth edge opposite to the third edge;
a plurality of third support patterns arranged in the third open region and that extend from a third end of the lower solder resist layer to the third edge; and
a plurality of fourth support patterns arranged in the fourth open region and that extend from a fourth end of the lower solder resist layer to the fourth edge.

19. The semiconductor package of claim 14, wherein the lower insulating layer comprises a plurality of lower insulating layers,
the second lower wiring layer comprises a plurality of second lower wiring layers respectively on the plurality of lower insulating layers, and the plurality of first support patterns and the plurality of second support patterns are positioned on a level corresponding to a level of an outermost lower wiring layer among the plurality of second lower wiring layers.

20. A semiconductor package comprising:

a package substrate comprising:

a substrate body;

a lower wiring layer on a lower surface of the substrate body and comprising a land region;

an upper wiring layer on an upper surface of the substrate body and electrically connected to the lower wiring layer; and a solder resist layer on the lower surface of the substrate body and including an opening that exposes the land region;

a semiconductor chip on the package substrate and comprising a plurality of contact pads electrically connected to the upper wiring layer; and a mold part on the package substrate and that seals the semiconductor chip, wherein the package substrate further comprises:

a first open region defined by a first portion of a bottom surface of the package substrate on which the solder resist layer is not present and that is adjacent to a first edge of the package substrate on the bottom surface of the package substrate;

a second open region defined by a second portion of the bottom surface of the package substrate on which the solder resist layer is not present and that is adjacent to a second edge of the package substrate on the bottom surface of the package substrate, the second edge opposite to the first edge;

a plurality of first support patterns arranged in the first open region and that extend, in a first horizontal direction, from a first end of the solder resist layer in the first horizontal direction to the first edge; and a plurality of second support patterns arranged in the second open region and that extend, in a second horizontal direction, from a second end of the solder resist layer in the second horizontal direction to the second edge, wherein the plurality of first support patterns comprises:

a metal layer that is on a same level as a level of the lower wiring layer; and a protective layer in the first open region and that is formed of a material that is the same as a material of a plating layer of the land region, and wherein the plurality of second support patterns comprises:

a metal layer that is on a same level as the level of the lower wiring layer; and a protective layer in the second open region and that is formed of a material that is the same as the material of the plating layer of the land region.

* * * * *